United States Patent
Hino et al.

(10) Patent No.: US 11,049,963 B2
(45) Date of Patent: Jun. 29, 2021

(54) SILICON CARBIDE SEMICONDUCTOR DEVICE AND POWER CONVERTER

(71) Applicant: Mitsubishi Electric Corporation, Tokyo (JP)

(72) Inventors: Shiro Hino, Tokyo (JP); Yuichi Nagahisa, Tokyo (JP); Koji Sadamatsu, Tokyo (JP); Hideyuki Hatta, Tokyo (JP); Kotaro Kawahara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/757,767

(22) PCT Filed: Dec. 18, 2018

(86) PCT No.: PCT/JP2018/046575
§ 371 (c)(1),
(2) Date: Apr. 21, 2020

(87) PCT Pub. No.: WO2019/124378
PCT Pub. Date: Jun. 27, 2019

(65) Prior Publication Data
US 2020/0295177 A1    Sep. 17, 2020

(30) Foreign Application Priority Data
Dec. 19, 2017    (JP) .............................. JP2017-242643

(51) Int. Cl.
*H01L 29/78* (2006.01)
*H01L 29/06* (2006.01)
(Continued)

(52) U.S. Cl.
CPC ...... *H01L 29/7806* (2013.01); *H01L 29/0696* (2013.01); *H01L 29/1608* (2013.01); *H01L 29/47* (2013.01)

(58) Field of Classification Search
CPC combination set(s) only.
See application file for complete search history.

(56) References Cited

U.S. PATENT DOCUMENTS

2012/0153303 A1    6/2012    Uchida
2012/0286290 A1    11/2012    Uchida
(Continued)

FOREIGN PATENT DOCUMENTS

JP    2003-017701 A    1/2003
JP    2012-216705 A    11/2012
(Continued)

OTHER PUBLICATIONS

U.S. Appl. No. 16/759,731, filed Apr. 28, 2020 is a co-pending related application to the present application.
(Continued)

*Primary Examiner* — Moin M Rahman
(74) *Attorney, Agent, or Firm* — Xsensus LLP

(57) ABSTRACT

In SiC-MOSFETs including Schottky diodes, passage of a bipolar current to a well region in an edge portion of an active region cannot be sufficiently reduced, which may reduce the reliability of elements. In a SiC-MOSFET including Schottky diodes, the Schottky diodes formed in a terminal region are made higher in density in a plane direction than those formed in the active region or intervals between the Schottky diodes in the plane direction are shortened, without an ohmic connection between the well and the source in the terminal region.

16 Claims, 22 Drawing Sheets

(51) Int. Cl.
H01L 29/16 (2006.01)
H01L 29/47 (2006.01)

(56) References Cited

U.S. PATENT DOCUMENTS

| | | |
|---|---|---|
| 2014/0252378 A1 | 9/2014 | Ota et al. |
| 2015/0236012 A1 | 8/2015 | Hino et al. |
| 2016/0079411 A1 | 3/2016 | Hino et al. |
| 2017/0040423 A1* | 2/2017 | Inoue ............... H01L 29/06 |
| 2017/0236935 A1 | 8/2017 | Ebihara et al. |
| 2018/0097103 A1 | 4/2018 | Sadamatsu et al. |
| 2019/0057873 A1 | 2/2019 | Sugahara et al. |
| 2019/0181259 A1 | 6/2019 | Hino et al. |
| 2019/0371935 A1 | 12/2019 | Hatta et al. |
| 2019/0371936 A1 | 12/2019 | Nagahisa et al. |

FOREIGN PATENT DOCUMENTS

| | | |
|---|---|---|
| JP | 2014-045211 A | 3/2014 |
| JP | 2014-175412 A | 9/2014 |
| WO | 2011/027540 A1 | 3/2011 |
| WO | 2012/056705 A1 | 5/2012 |
| WO | 2014/038110 A1 | 3/2014 |
| WO | 2014/162969 A1 | 10/2014 |
| WO | 2016/052261 A1 | 4/2016 |
| WO | 2016/170706 A1 | 10/2016 |
| WO | 2017/169086 A1 | 10/2017 |
| WO | 2017/179102 A1 | 10/2017 |
| WO | 2018/155553 A1 | 8/2018 |
| WO | 2018/155566 A1 | 8/2018 |

OTHER PUBLICATIONS

U.S. Appl. No. 16/885,319, filed May 28, 2020 is a co-pending related application to the present application.
Office Action dated Mar. 2, 2021, in corresponding Japanese patent Application No. 2020-077214, 11 pages.
International Search Report and Written Opinion dated Mar. 26, 2019 for PCT/JP2018/046575 filed on Dec. 18, 2018, 11 pages including English Translation of the International Search Report.

* cited by examiner

F I G. 2 2
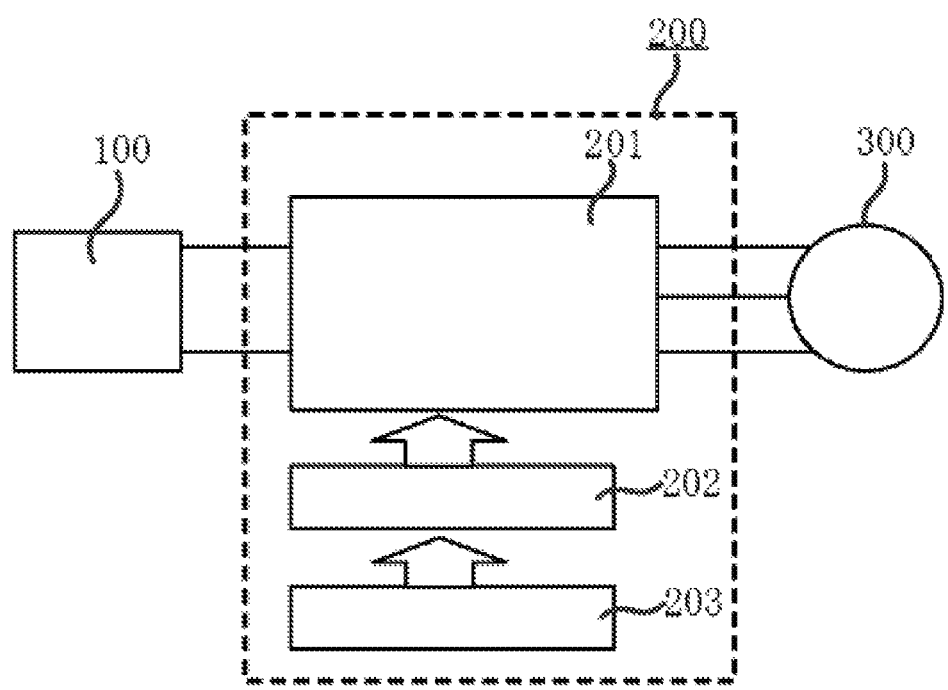

SILICON CARBIDE SEMICONDUCTOR DEVICE AND POWER CONVERTER

CROSS-REFERENCE TO RELATED APPLICATIONS

The present application is based on PCT filing PCT/JP2018/046575, filed Dec. 18, 2018, which claims priority to JP 2017-242643, filed Dec. 19, 2017, the entire contents of each are incorporated herein by reference.

TECHNICAL FIELD

The present invention relates to a silicon carbide semiconductor device made of silicon carbide and to a power converter.

BACKGROUND ART

It is known that continuously passing a forward current, specifically, a bipolar current through a p-n diode made of silicon carbide (SiC) creates a problem in the reliability, that is, stacking faults in crystals which cause a forward voltage to shift. This probably occurs due to expansion of the stacking faults, specifically, plane defects with recombination energy obtained when minority carriers implanted through the p-n diode are recombined with majority carriers. The expansion originates from, for example, a basal plane dislocation in a silicon carbide substrate. The stacking faults obstruct the current flow. Hence, the expansion of the stacking faults reduces the current and increases the forward voltage, thus causing reduction in the reliability of a semiconductor device.

Such increase in the forward voltage also occurs in vertical metal oxide semiconductor field effect transistors (MOSFETs) made of silicon carbide. The vertical MOSFETs include a parasitic p-n diode (body diode) between a source and a drain. When the forward current flows through this body diode, the vertical MOSFETs also suffer from the reduction in the reliability, similarly to the p-n diode. When a body diode of a SiC-MOSFET is used as a free-wheeling diode of a MOSFET, the characteristics of this MOSFET may be degraded.

One method for solving the problem in the reliability due to the passage of the forward current through the parasitic p-n diode is to apply stress for passing a forward current through the parasitic p-n diode for a long time, measure changes between a forward voltage before the stress application and a forward voltage after the stress application, and eliminate (screen out) an element with large change in the forward voltage from products as described in Patent Document 1. However, this method has disadvantages of prolonging the duration of current passage and producing many defective items by using wafers with many defects.

Another method is to incorporate and use, in a semiconductor device as a unipolar transistor such as a MOSFET, unipolar diodes as free-wheeling diodes. For example, Patent Documents 2 and 3 each describe a method for incorporating Schottky barrier diodes (SBD) as unipolar diodes into a unit cell of a MOSFET.

When such a unipolar transistor including, in an active region, unipolar diodes, specifically, diodes in which a current is passed through only majority carriers is applied as an SiC semiconductor device, no bipolar current flows through the body diodes during a free-wheeling operation by designing a diffusion potential of the unipolar diodes, specifically, a voltage for starting current passage to be lower than a diffusion potential at a p-n junction. This can suppress degradation in characteristics of the unipolar transistor in the active region.

Even in the unipolar transistor including the unipolar diodes in the active region, a terminal region, namely, a region other than the active region, however, may have a portion with a parasitic p-n diode where the unipolar diodes are hardly disposed due to its structure.

For example, a region near a gate pad or near a terminal portion of a semiconductor device has a terminal well region protruding toward the periphery more than a source electrode. A parasitic p-n diode is formed between this terminal well region and a drift layer. In this portion, neither a Schottky electrode nor a unipolar diode is formed. Since there is no Schottky electrode in the terminal well region, a voltage between the source electrode and a drain electrode is applied to the p-n diode formed by the terminal well region and the drift layer. As a result, a bipolar current flows through the p-n diode.

When this portion includes, for example, the origin of the basal plane dislocation, the stacking faults may be expanded, which may reduce the breakdown voltage of a transistor. Specifically, a leakage current may occur when the transistor is in an OFF state, and the heat generated from the leakage current may break an element or a circuit.

This problem should be avoided by limiting, to a certain value or less, a voltage to be applied between the source and the drain so that a bipolar current is prevented from flowing through the p-n diode formed by the terminal well region and the drift layer. Therefore, the chip size should be increased to reduce a voltage between the source and the drain which is generated when a free-wheeling current flows. However, this brings disadvantages of increase in the chip size and the cost.

Methods for suppressing a forward operation of the p-n diode formed by the terminal well region and the drift layer without increasing the chip size include a method for increasing the resistance of a current path formed between each portion of the terminal well region and a source electrode. Examples of the method for increasing the resistance of the current path include a method for increasing the contact resistance between the terminal well region and the source electrode (e.g. Patent Document 4). When a bipolar current flows through the p-n diode formed by the terminal well region and the drift layer in such a structure, the resistance component causes a voltage drop. Thus, a difference between a potential of the terminal well region and a source potential is created, and the forward voltage to be applied to the p-n diode is reduced by the difference. Thus, the passage of the bipolar current can be suppressed.

Moreover, a method for fabricating Schottky barrier diodes (SBDs) in a terminal well region is known (e.g. Patent Document 5).

PRIOR ART DOCUMENT

Patent Document

| [Patent Document 1] | Japanese Patent Application Laid-Open No 2014-175412 |
| [Patent Document 2] | Japanese Patent Application Laid-Open No. 2003-017701 |
| [Patent Document 3] | WO2014-038110 |
| [Patent Document 4] | WO2014-162969 |
| [Patent Document 5] | WO2016-052261 |

SUMMARY

Problem to be Solved by the Invention

When an electrode having an ohmic connection to a source electrode is formed in a terminal well region, even if the contact resistance between the terminal well region and the source electrode is increased, sometimes, the resistance of the current path formed between the terminal well region and the source electrode cannot be sufficiently increased and the passage of the bipolar current to the terminal well region cannot be sufficiently reduced.

Moreover, even when SBDs are formed in a terminal well region, the passage of the bipolar current to the terminal well region or to a well region in an edge portion of an active region sometimes cannot be sufficiently reduced.

The present invention has been conceived to solve the problems, and has an object of providing a more reliable silicon carbide semiconductor device.

Means to Solve the Problem

A silicon carbide semiconductor device according to the present invention includes: a semiconductor substrate made of silicon carbide of a first conductivity type, a drift layer of a first conductivity type, the drift layer being formed on the semiconductor substrate; a plurality of first well regions of a second conductivity type, the first well regions being formed in a surface layer of the drift layer; a plurality of first separation regions of the first conductivity type, the first separation regions being formed adjacent to the first well regions from a surface of the first well regions to the drift layer; a first Schottky electrode formed on each of the first separation regions, the first Schottky electrode forming a Schottky junction with the first separation region; an ohmic electrode formed on each of the first well regions; a second well region of the second conductivity type, the second well region being formed in the surface layer of the drift layer separately from the first well regions; a plurality of fourth separation regions of the first conductivity type, the fourth separation regions being formed adjacent to the second well region from a surface of the second well region to the drift layer and formed at intervals shorter than intervals of the first separation regions; a second Schottky electrode formed on each of the fourth separation regions, the second Schottky electrode forming a Schottky junction with the fourth separation region; a source region of the first conductivity type, the source region being formed in a surface layer area of each of the first well regions; a gate insulating film formed on the first well regions and the second well region; a gate electrode formed on the gate insulating film on the first well regions and the second well region; a gate pad connected to the gate electrode and formed above the second well region; and a source electrode electrically connected to the first Schottky electrodes, the second Schottky electrodes, and the ohmic electrodes, the source electrode having a non-ohmic connection to the second well region.

Effects of the Invention

In the silicon carbide semiconductor device according to the present invention, a bipolar current can be significantly prevented from flowing through a well region in an edge portion of an active region, which can enhance the reliability.

BRIEF DESCRIPTION OF DRAWINGS

FIG. 22 is a schematic view illustrating a configuration of a power converter according to Embodiment 5 of this invention.

DESCRIPTION OF EMBODIMENTS

Figure 1:
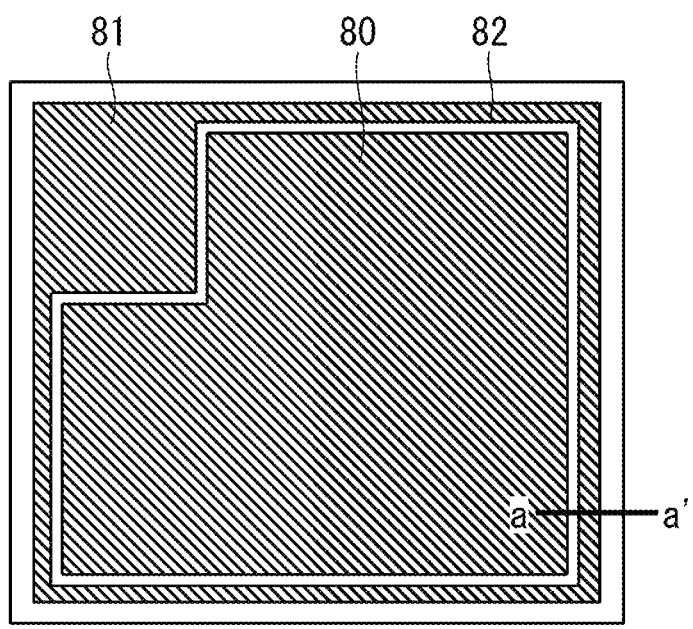
FIG. 1 is a schematic plan view of a silicon carbide semiconductor device according to Embodiment 1 of this invention when viewed from the top surface.

Embodiments will be described below with reference to the accompanying drawings. Since the drawings are schematically illustrated, the mutual relationships in size and position between images in the different drawings are not necessarily accurate but may be changed when needed. In the following description, the same reference numerals are assigned to the same constituent elements, and their names and functions are the same. Thus, the detailed description thereof may be omitted.

Embodiments in the DESCRIPTION will describe n-channel silicon carbide MOSFETs whose first conductivity type is n-type and whose second conductivity type is p-type, as example silicon carbide (SiC) semiconductor devices. A potential level will be described assuming the first conductivity type as n-type and the second conductivity type as p-type. Conversely, if the first conductivity type is p-type and the second conductivity type is n-type, the potential level will be described the other way around.

Furthermore, this application will describe a region of a silicon carbide semiconductor device where unit cells are periodically arranged as an active region, and a region other than the active region as a terminal region.

Embodiment 1

First, a structure of a silicon carbide semiconductor device according to Embodiment 1 of the present invention will be described.

FIG. 1 is a schematic plan view of a silicon carbide MOSFET with built-in Schottky diodes (SBDs) (SiC-MOSFET with built-in SBDs) as the silicon carbide semiconductor device according to Embodiment 1 when viewed from the top surface. In FIG. 1, a gate pad 81 is formed partly in an upper surface of the SiC-MOSFET, and a source electrode 80 is formed adjacent to the gate pad 81. A gate line 82 is formed to extend from the gate pad 81.

Figure 2:
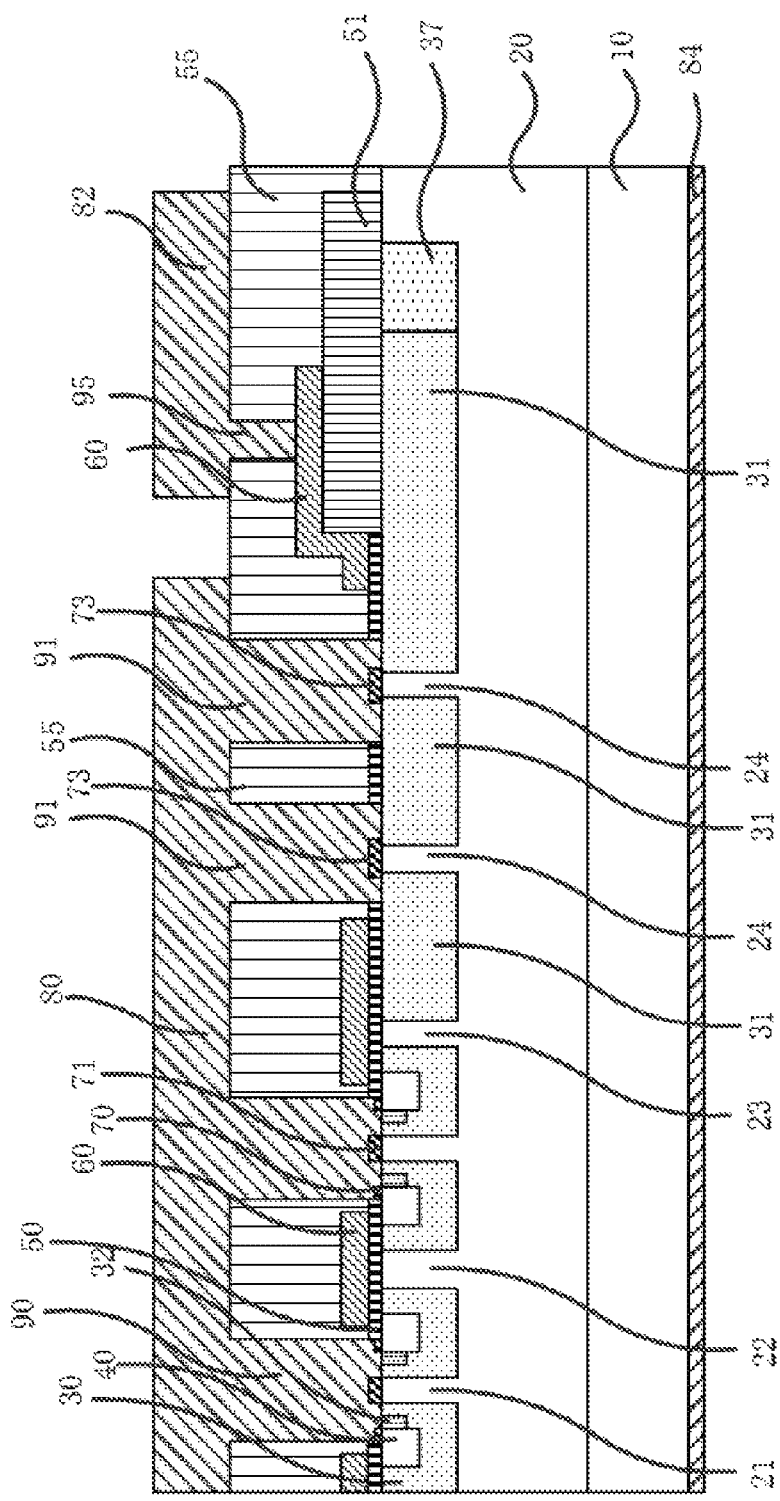
FIG. 2 is a schematic sectional view of the silicon carbide semiconductor device according to Embodiment 1 of this invention.
Figure 3:
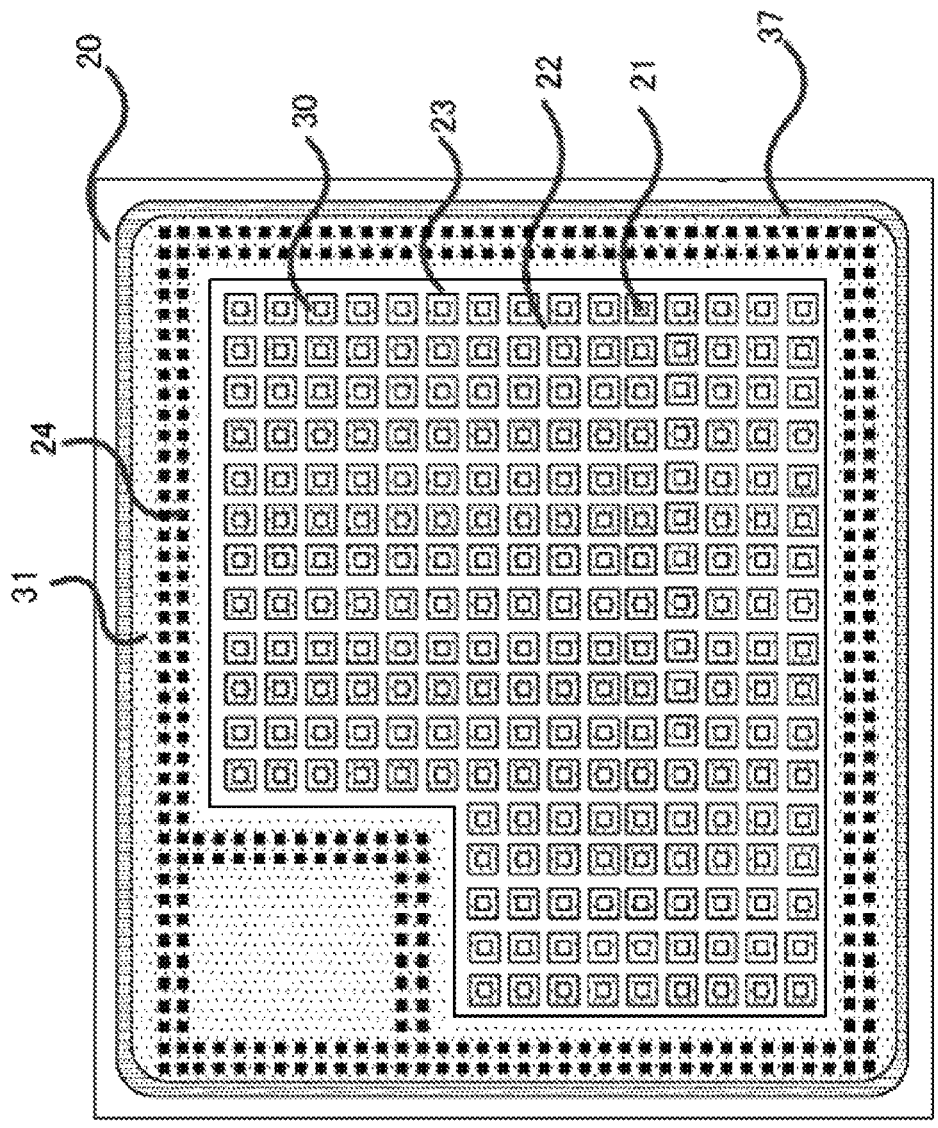
FIG. 3 is a schematic plan view of the silicon carbide semiconductor according to Embodiment 1 of this invention.

FIG. 2 is a schematic sectional view schematically illustrating a cross section corresponding to the line a-a' from the source electrode 80 to the gate line 82 on the periphery of the silicon carbide semiconductor device in FIG. 1. FIG. 3 is a schematic plan view mainly illustrating a silicon carbide semiconductor portion in the top view of FIG. 1.

In FIG. 2, a drift layer 20 made of n-type silicon carbide is formed on a surface of a semiconductor substrate 10 made of silicon carbide of n-type and low resistance. As shown in FIG. 3, a second well region 31 made of p-type silicon carbide is formed in a surface layer area of the drift layer 20 substantially corresponding in position to a region with the gate line 82 described with reference to FIG. 1.

A plurality of first well regions 30 made of p-type silicon carbide are formed in the surface layer area of the drift layer 20 and under a region with the source electrode 80 described with reference to FIG. 1. In a surface layer area of each of the first well regions 30, a source region 40 made of n-type silicon carbide is formed at a position inner than the periphery of the first well region 30 by a predetermined distance.

A contact region 32 made of silicon carbide of low resistance and p-type is formed in the surface layer area of each of the first well regions 30 which is inner than the source region 40 in the surface layer area of the first well region 30. First separation regions 21 made of silicon carbide and further inner than the contact regions 32 are formed through the first well regions 30. The first separation regions 21 should be formed near the first well regions 30, and may be adjacent to the first well regions 30 without penetrating through the first well regions 30. The first separation regions 21 are of n-type similarly to the drift layer 20, and have the same impurity concentration as that of the drift layer 20.

A first Schottky electrode 71 forming a Schottky connection (a Schottky junction) with each of the first separation regions 21 is formed on a surface of the first separation region 21. Here, the first Schottky electrode 71 is preferably formed to include at least the corresponding first separation region 21 when viewed from the top surface.

An ohmic electrode 70 is formed on a surface of the source region 40. The source electrode 80 to be connected to the ohmic electrodes 70, the first Schottky electrodes 71, and the contact regions 32 is formed on the surface of these. The first well regions 30 can easily exchange electrons and holes with the ohmic electrodes 70 through the contact regions 32 of low resistance.

Regions between the adjacent first well regions 30 in the drift layer 20 are second separation regions 22. The second separation regions 22 are of n-type similarly to the drift layer 20, and have the same impurity concentration as that of the drift layer 20. A gate insulating film 50 is formed on the surface of the adjacent first well regions 30, the second separation regions 22 between the adjacent first well regions 30, and the source regions 40 in the first well regions 30. A gate electrode 60 is formed on the gate insulating film 50 at least on the first well regions 30. The surface layer area of the first well regions 30, which is below a portion where the gate electrode 60 is formed and faces the gate electrode 60 through the gate insulating film 50, will be referred to as a channel region.

A region in which the first well regions 30 in the source electrode 80 in FIG. 1 of the silicon carbide semiconductor device is formed is an active region. The second well region 31 is formed outside the active region, that is, outside the first well regions 30 around the outermost circumference. A third separation region 23 is formed between the first well regions 30 and the second well region 31. The third separation region 23 is of n-type similarly to the drift layer 20, and has the same impurity concentration as that of the drift layer 20.

A region outside the region in which the second well region 31 is formed is a terminal region.

A plurality of fourth separation regions 24 penetrating through the second well region 31 and made of silicon carbide are formed inside the second well region 31. The fourth separation regions 24 should be formed near the second well region 31, and may be adjacent to the second well region 31 without penetrating through the second well region 31. Here, a second Schottky electrode 73 forming a Schottky connection with each of the formed fourth separation regions 24 is formed on a surface of the fourth separation region 24. Here, the second Schottky electrode 73 is preferably formed to include at least the corresponding fourth separation region 24 when viewed from the top surface.

The gate insulating film 50 and a field insulating film 51 are formed on the second well region 31. The gate electrode 60 is formed on the gate insulating film 50 and the field insulating film 51. An interlayer insulating film 55 is formed between the gate electrode 60 and the source electrode 80. Further, the gate electrode 60 and the gate line 82 above the second well region 31 are connected with each other through gate contact holes 95 formed in the interlayer insulating film 55. A p-type JTE region 37 made of silicon carbide is formed around the periphery of the second well region 31, specifically, on the opposite side of the first well regions 30. The JTE region 37 is lower in impurity concentration than the second well region 31.

Openings (second contact holes 91) are formed partly in the gate insulating film 50 on the surface of the second well region 31. The source electrode 80 connected to, for example, the second Schottky electrodes 73 and the ohmic electrodes 70 is formed in the openings. Here, the second well region 31 does not have a direct ohmic connection to the source electrode 80, but is insulated from or forms a Schottky connection with the source electrode 80.

In the active region, the source electrode 80 on the ohmic electrodes 70, the first Schottky electrodes 71, and the contact regions 32 is connected to the source electrode 80 on the interlayer insulating film 55 through a first contact hole 90 formed through the interlayer insulating film 55 and the gate insulating film 50.

A drain electrode 84 is formed on a rear surface of the semiconductor substrate 10.

Here, the second Schottky electrode 73 needs to be larger than the fourth separation region 24 to cover the entire plane region of the fourth separation region 24. This is because if the fourth separation region 24 slightly has a region that is not covered with an electrode having Schottky characteristics, a leakage current occurs in the portion in an OFF state and a desired breakdown voltage cannot be achieved. Since it is not possible to completely match the sizes of the fourth separation region 24 and the second Schottky electrode 73 due to variations that may occur in manufacturing processes such as mask misalignment, the fourth separation region 24 needs to be reliably covered with the second Schottky electrode 73 by designing the second Schottky electrode 73 to be larger than the fourth separation region 24.

Thus, the second Schottky electrode 73 needs to be in contact with the second well region 31 around the fourth separation regions 24. If the second Schottky electrode 73 and the second well region 31 exhibit ohmic characteristics as the contact characteristics, suppression of the passage of a bipolar current through the second well region 31, which is the advantage of the present invention, cannot be implemented. To avoid this problem, the second Schottky electrode 73 according to the present invention has the Schottky characteristics not only for the fourth separation region 24 but also for the second well region 31. Specifically, tunneling leakage at the semiconductor/Schottky interface is suppressed by sufficiently reducing the surface concentration of the second well region 31. To implement this, the surface concentration of the second well region 31 should be lower than or equal to $1\times10^{19}$ cm$^{-3}$ and preferably lower than or equal to $1\times10^{18}$ cm$^{-3}$.

It is preferred that the width of the fourth separation region 24 is identical to that of the first separation region 21, or less than or equal to three times the width of the first separation region 21 even if the fourth separation region 24 is wider than the first separation region 21. This is because if the fourth separation region 24 is wide, the Schottky interface formed in an OFF state by the contact of the second Schottky electrode 73 and the fourth separation region 24 is subjected to a high electric field, and the leakage current increases. This consequently increases the loss and results in a failure of obtaining a desired breakdown voltage.

Next, a method for manufacturing the SiC-MOSFET with built-in SBDs as the silicon carbide semiconductor device according to Embodiment 1 will be described.

First, the drift layer 20 made of n-type silicon carbide having an impurity concentration from $1\times10^{15}$ to $1\times10^{17}$ cm$^{-3}$ and having a thickness from 5 to 50 μm is epitaxially grown by chemical vapor deposition (CVD) on the semiconductor substrate 10 whose first main surface in one plane direction is a (0001) plane with an off angle, which has a 4H polytype, and which is made of silicon carbide of n-type and low resistance.

Next, an implantation mask is formed in a predetermined region on the surface of the drift layer 20 using, for example, a photoresist. Then, p-type impurities such as aluminum (Al) are ion-implanted. Here, the depth of the ion-implanted Al approximately ranges from 0.5 to 3 μm, which does not exceed the thickness of the drift layer 20. The impurity concentration of the ion-implanted Al ranges from $1\times10^{17}$ to $1\times10^{19}$ cm$^{-3}$, which is higher than that of the drift layer 20. Then, the implantation mask is removed. With this process, the ion-implanted Al region becomes the first well regions 30 and the second well region 31.

Next, an implantation mask is formed on the surface of the drift layer 20 using, for example, a photoresist. Then, p-type impurities such as Al are ion-implanted. Here, the depth of the ion-implanted Al approximately ranges from 0.5 to 3 μm, which does not exceed the thickness of the drift layer 20. The impurity concentration of the ion-implanted Al ranges from $1\times10^{16}$ to $1\times10^{18}$ cm$^{-3}$, which is higher than that of the drift layer 20 and lower than that of the first well regions 30. Then, the implantation mask is removed. With this process, the ion-implanted Al region becomes the JTE region 37. Likewise, ion-implanting Al into a predetermined region with an impurity concentration higher than that of the first well regions 30 forms the contact regions 32.

Next, an implantation mask is formed using, for example, a photoresists so that a predetermined portion inside each of the first well regions 30 on the surface of the drift layer 20 is opened. Then, n-type impurities such as nitrogen (N) are ion implanted. The depth of the ion-implanted N is less than the thickness of the first well regions 30. The impurity concentration of the ion-implanted N ranges from $1\times10^{18}$ to $1\times10^{21}$ cm$^{-3}$, which exceeds the p-type impurity concentration of the first well regions 30. N-type regions in the regions where N has been implanted in this process become the source regions 40.

Next, a thermal processing device performs annealing in an inert gas atmosphere such as argon (Ar) at a temperature from 1300 to 1900° C. for 30 seconds to 1 hour. This annealing electrically activates the ion implanted N and Al.

Then, the field insulating film 51 made of silicon oxide and having a thickness from 0.5 to 2 μm is formed by, for example, CVD or a photolithography technique on the semiconductor layer in a region other the active region which substantially corresponds to a region where the first well regions 30 are formed.

Next, the surface of silicon carbide that is not covered with the field insulating film 51 is thermally oxidized to form a silicon oxide film as the gate insulating film 50 with a desired thickness. Then, a polycrystalline silicon film having conductivity is formed by low pressure CVD on the gate insulating film 50 and the field insulating film 51, and is patterned to form the gate electrode 60. Next, the interlayer insulating film 55 made of silicon oxide is formed by low pressure CVD. Then, the first contact hole 90 is formed through the interlayer insulating film 55 and the gate insulating film 50 and reach the contact regions 32 and the source regions 40 in the active region. At the same time, the second contact holes 91 are formed to reach the second well region 31.

Next, a metal film mainly containing Ni is formed by, for example, sputtering. Then, the metal film is subjected to a thermal process at a temperature from 600 to 1100° C. so that the metal film mainly containing Ni reacts with a silicon carbide layer in the first contact hole 90, thereby forming a silicide between the silicon carbide layer and the metal film. Next, the residual metal film other than the silicide resulting from the reaction is removed by wet etching. Consequently, the ohmic electrodes 70 are formed.

Then, a metal film mainly containing Ni is formed on the rear surface (second main surface) of the semiconductor substrate 10 and thermally processed, thereby forming a rear surface ohmic electrode (not illustrated) on the rear side of the semiconductor substrate 10.

Next, portions of the interlayer insulating film 55 and the gate insulating film 50 on the first separation regions 21 and the fourth separation regions 24, and portions of the interlayer insulating film 55 at positions where the gate contact holes 95 are to be formed are removed by patterning using, for example, a photoresist. The removing method is wet-etching that does not damage the surface of the silicon carbide layer to be the Schottky interface.

Then, a metal film to be formed into Schottky electrodes is deposited by, for example, sputtering. Then, the first Schottky electrodes 71 and the second Schottky electrodes 73 are formed on the first separation regions 21 in the first contact hole 90 and on the fourth separation regions 24 in the second contact holes 91, respectively, by patterning using, for example, a photoresist.

Next, a wiring metal made of, for example, Al is formed by sputtering or vapor deposition on the surface of the substrate that is being processed so far, and is processed into a predetermined shape by a photolithographic technique to form the source electrode 80 in contact with the ohmic electrodes 70, the first Schottky electrodes 71, the second Schottky electrodes 73, and the second well region 31 for the source and form the gate pad 81 and the gate line 82 that are in contact with the gate electrode 60.

Further, the drain electrode 84 is formed as a metal film on the surface of the rear surface ohmic electrode (not illustrated) formed on the rear surface of the substrate, thus completing the fabrication of the silicon carbide semiconductor device according to Embodiment 1 that is illustrated in FIGS. 1 to 3.

Next, operations of the SiC-MOSFET with built-in SBDs as the silicon carbide semiconductor device according to Embodiment 1 will be described Here, an example silicon carbide semiconductor device made of 4H-type silicon carbide as a semiconductor material will be described. In this case, a diffusion potential at a p-n junction is approximately 2 V.

Hereinafter, free-wheeling operations will be mainly described.

A voltage of several volts is generated in the free-wheeling operations, as a drain voltage (a voltage at the drain electrode 84) is lower than a source voltage (a voltage at the source electrode 80). Since SBDs that are turned ON with a voltage lower than that of the first well regions 30 are formed between the first separation regions 21 and the first Schottky electrodes 71 in the active region, in principle, the freewheeling current flows not through the first well regions 30 but through the SBDs. When the terminal region includes the source electrode 80 having an ohmic connection to the second well region 31 through the ohmic electrode, much of the voltage between the source and the drain is applied to the p-n junction formed between the second well region 31 and the drift layer 20, thereby causing a bipolar current to flow through the p-n diode formed by the second well region 31 and the drift layer 20. However, the second well region 31 has a non-ohmic connection to the source electrode 80, but is insulated from or forms a Schottky connection with the source electrode 80 in the silicon carbide semiconductor device according to the present invention. Further, SBDs are formed between the plurality of fourth separation regions 24 formed through the second well region 31 and the second Schottky electrodes 73 on the fourth separation regions 24.

However, since the second well region 31 has a non-ohmic connection to the source electrode 80 according to the present invention, the SBD current passing through the fourth separation regions 24 formed through this second well region 31 hardly flows. To describe this phenomenon, change in the potential of the second well region 31 during the free-wheeling operations will be described.

During the free-wheeling operations, a negative voltage, for example, −10 V is generated in the drain electrode 84 when the source voltage is set to zero. Then, a current flows from the source electrode 80 to the drain electrode 84. Since a potential distribution corresponding to a resistance ratio is generated in a path from the source electrode 80 to the drain electrode 84, a potential between the source electrode 80 and the drain electrode 84 (e.g., −3 V) is generated in a portion of the drift layer 20 that is in contact with the second well region 31. If the second well region 31 has an ohmic connection to the source electrode 80, the potential of the second well region 31 is maintained at approximately 0 V. Thus, the forward voltage (3 V in this example) is applied to the p-n junction, and the bipolar current flows through the p-n junction.

In contrast, since the second well region 31 has a non-ohmic connection to the source electrode 80 according to the present invention, the second well region 31 is charged up, so that the second well region 31 is charged to a potential (e.g., −2 V) between a potential of the portion of the drift layer 20 that is in contact with the second well region 31, and a potential of the source electrode 80.

Here, take note of the p-n junction formed by the fourth separation regions 24 and the second well region 31. The reverse bias to be applied to the p-n junction when the second well region 31 has a non-ohmic connection to the source electrode 80 is higher than that when the second well region 31 has an ohmic connection thereto, by the potential charged up by the second well region 31. The reverse bias to be applied to the p-n junction formed by the fourth separation regions 24 and the second well region 31 forms respective depletion layers in the fourth separation regions 24 and the second well region 31. The depletion layers spread out particularly over the fourth separation regions 24 with relatively low impurity concentration. Since the SBD current needs to pass through the fourth separation regions 24 in which a current path is effectively narrowed by these depletion layers, a high resistance is developed in the fourth separation regions 24.

Thus, even though the first separation regions 21 and the fourth separation regions 24 are designed with the same width and the same impurity concentration, only a lower current can pass, with high resistance, through the fourth separation regions 24 sandwiched in the second well region 31 to be charged up than the current passing through the first separation regions 21.

When the density of the SBDs formed in the terminal region is lower than or identical to that of the SBDs formed in the active region, the SBD currents flowing through the SBDs in an edge portion of the active region and the SBDs in the terminal region are lower than the SBD current flowing through the SBDs in the center of the active region, and diffusively flow toward the circumferential direction of chips in which the SBD is not formed. Thus, the SBD current flowing through the drift layer 20 or the semiconductor substrate 10 in the edge portion of the active region is lower in density than those in the other portions in the active region. Consequently, a voltage drop occurring across the drift layer 20 or the semiconductor substrate 10 is less in the edge portion of the active region than in the other portions in the active region.

Here, the voltage to be applied between the source and the drain is identical within a chip, and a voltage obtained by subtracting the voltage drop occurring across the drift layer 20 and the semiconductor substrate 10 from the voltage between the source and the drain is applied to the p-n junction. Thus, the voltage to be applied to the p-n junction is higher in the edge portion of the active region than that in the other portions in the active region. Unlike the second well region 31 in the terminal region, the first well regions 30 have an ohmic connection to the source electrode 80 in the edge portion of the active region. Thus, the bipolar current flows with application of a voltage exceeding the diffusion potential to the p-n junction. The reason why the bipolar current flows is because the density of the SBD current flowing through the drift layer 20 and the semiconductor substrate 10 in the edge portion of the active region is low.

In the SiC-MOSFET with built-in SBDs as the silicon carbide semiconductor device according to Embodiment 1, the intervals between the SBDs formed in the second well region 31 in the terminal region are shorter than those of the SBDs in the active region. In other words, the SBDs formed in the second well region 31 in the terminal region are denser than the SBDs in the active region. Thus, even when the SBD current diffusively flows toward the periphery of the chips in which the SBD is not formed, the density of the SBD current in the edge portion of the active region is never lower than that of the SBD current in the other portions in the active region. Thus, the bipolar current that is a forward current can be prevented from flowing through the p-n junction between the first well regions 30 and the drift layer 20 in the edge portion of the active region. Moreover, expansion of the stacking faults in the p-n junction and reduction in the breakdown voltage due to this expansion of the stacking faults can be suppressed.

Methods for increasing the SBD current flowing through the fourth separation regions 24 include a method for widening the fourth separation regions 24 and increasing the n-type impurity concentration in the fourth separation regions 24. However, these methods increase the reverse bias to be applied to the SBDs when the breakdown voltage is maintained, which is not always favorable from the viewpoint of reliability.

Consequently, bipolar operations during the free-wheeling operations in the edge portion of the active region can be suppressed in the silicon carbide semiconductor device according to Embodiment 1, which can enhance the reliability.

Suppressing the bipolar operations during the free-wheeling operations in the silicon carbide semiconductor device according to Embodiment 1 is more effective when a distance between the SBDs in the edge portion of the active region and the SBDs in the terminal region is larger.

The reason is that the SBD current flowing from the SBDs in the edge portion of the active region spreads out in the circumferential direction as previously described. As the distance between the SBDs in the edge portion of the active region and the SBDs in the terminal region is larger, the SBD current in the edge portion of the active region easily spreads out in the circumferential direction. Here, making the intervals between the SBDs in the terminal region shorter than those of the SBDs in the active region similarly to the silicon carbide semiconductor device according to Embodiment 1 can prevent the SBD current in the edge portion of the active region from spreading out in the circumferential direction, prevent the bipolar current that is a forward current from flowing through the p-n junction between the first well regions 30 and the drift layer 20 in the edge portion of the active region, and prevent the expansion of the stacking faults in the p-n junction and reduction in the breakdown voltage due to this expansion of the stacking faults.

Figure 4:
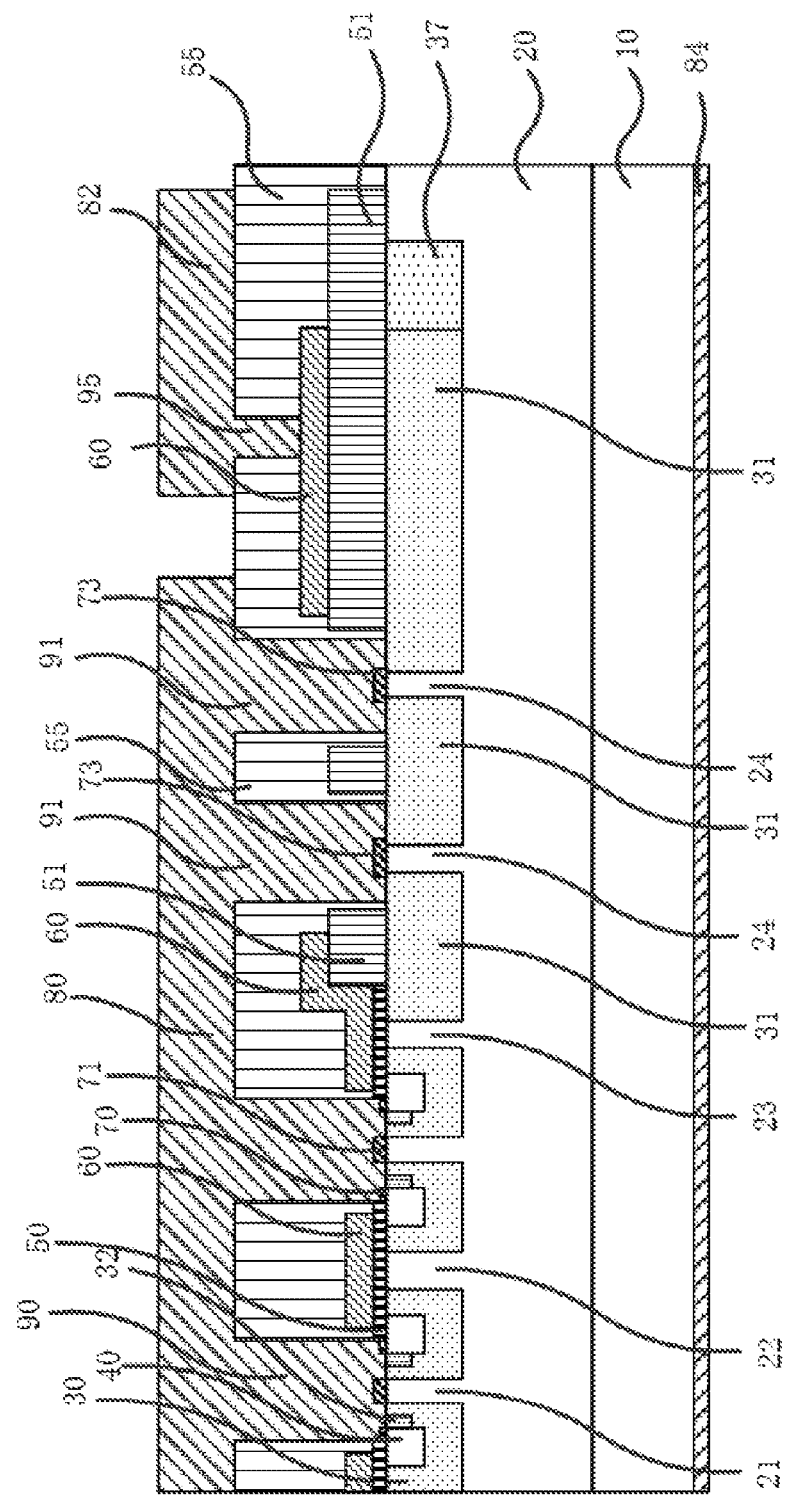
FIG. 4 is a schematic sectional view of a silicon carbide semiconductor device with another structure according to Embodiment 1 of this invention.

FIG. 4 is a schematic sectional view of the silicon carbide semiconductor device according to Embodiment 1 in which the field insulating film 51 is formed on most of the second well region 31. In the silicon carbide semiconductor device with the structure illustrated in FIG. 4, the gate insulating film 50 is formed on the second well region 31 in the active region, and the field insulating film 51 thicker than the gate insulating film 50 is formed on the second well region 31 at a distance from the active region.

Here, an edge portion of the field insulating film 51, that is, a boundary between the field insulating film 51 and the gate insulating film 50 is formed between the SBD in the edge portion of the active region and the innermost SBD in the terminal region. Then, the second contact holes 91 for forming the SBDs inside the second well region 31 are formed through the field insulating film 51. In the etching process for forming the second contact holes 91 to penetrate through the field insulating film 51 that is thicker than the gate insulating film 50, the amount of etching in the plane direction of chips, that is, side etching increases. Since complete positions of the field insulating film 51 in the edge portion and the side walls of the second contact holes 91 are prone to variations, dimensional margin is required in the plane direction of chips with considerations given to these variations. Consequently, the distance between the SBD in the edge portion of the active region and the innermost SBD in the terminal region is larger than an interval between the SBDs in the active region.

Here, the intervals between the SBDs in the terminal region are shorter than intervals between the SBDs in the active region as illustrated in the schematic sectional view of FIG. 4, which can prevent the SBD current in the edge portion of the active region from spreading out in the circumferential direction, and prevent the bipolar current that is a forward current from flowing through the p-n junction between the first well regions 30 and the drift layer 20 in the edge portion of the active region. Consequently, this can prevent the expansion of the stacking faults in the p-n junction and reduction in the breakdown voltage due to this expansion of the stacking faults.

The silicon carbide semiconductor device according to Embodiment 1 is particularly effective in a portion between the active region and a region where the gate contact holes 95 are to be formed. In such a portion, the potential of the gate electrode 60 needs to be carried by connecting the active region to the gate contact holes 95. Thus, the gate electrode 60 is not completely separated between the terminal region and the active region as illustrated in the sectional view of FIG. 4, but bridges for connecting portions of the gate electrode 60 are formed somewhere in the depth direction of the sectional view. Since the second contact hole 91 cannot be formed in a region where the bridges of the gate electrode 60 are formed, the SBD in the terminal region is not formed in the region.

Figure 5:
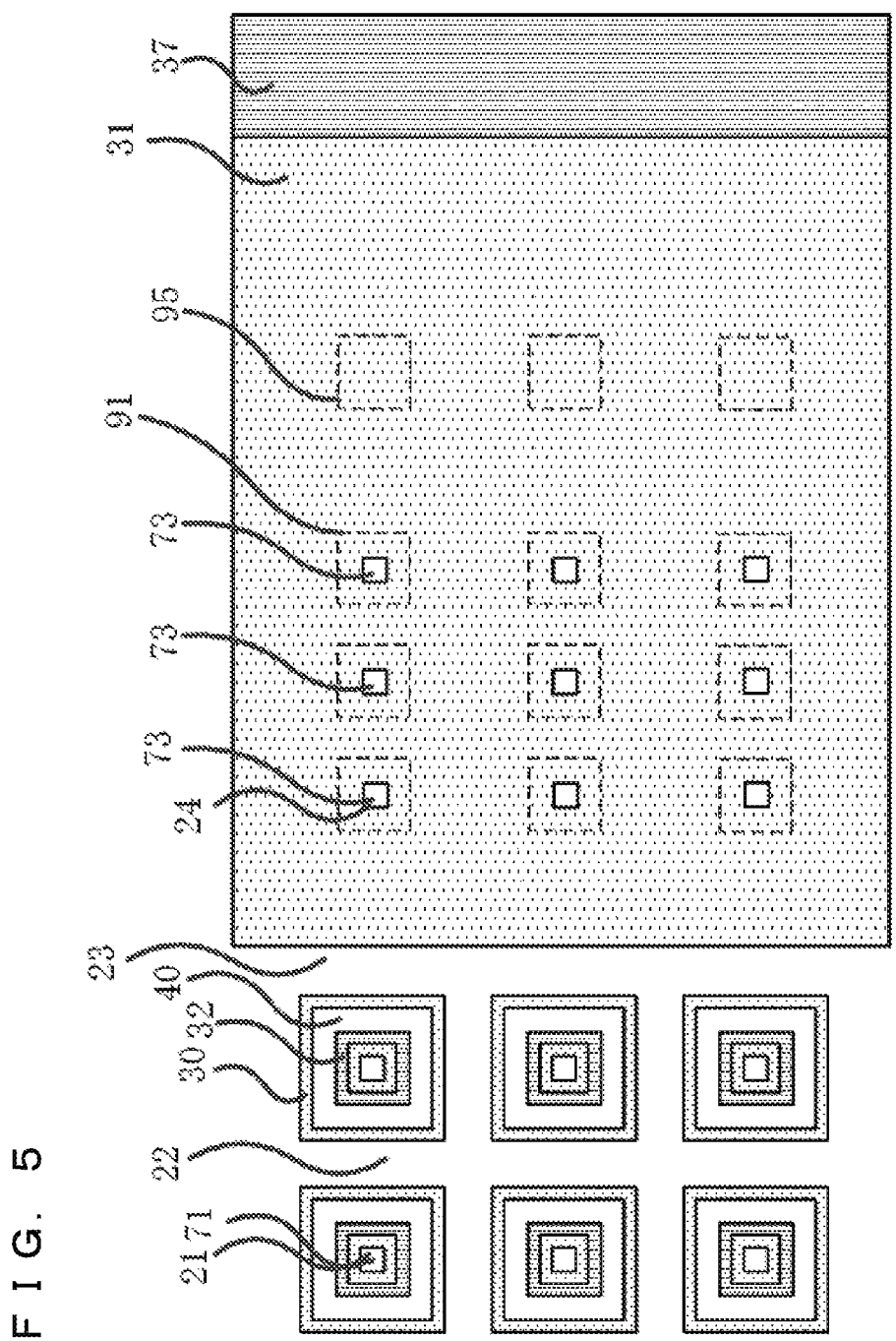
FIG. 5 is a schematic plan view of the silicon carbide semiconductor according to Embodiment 1 of this invention.
Figure 6:
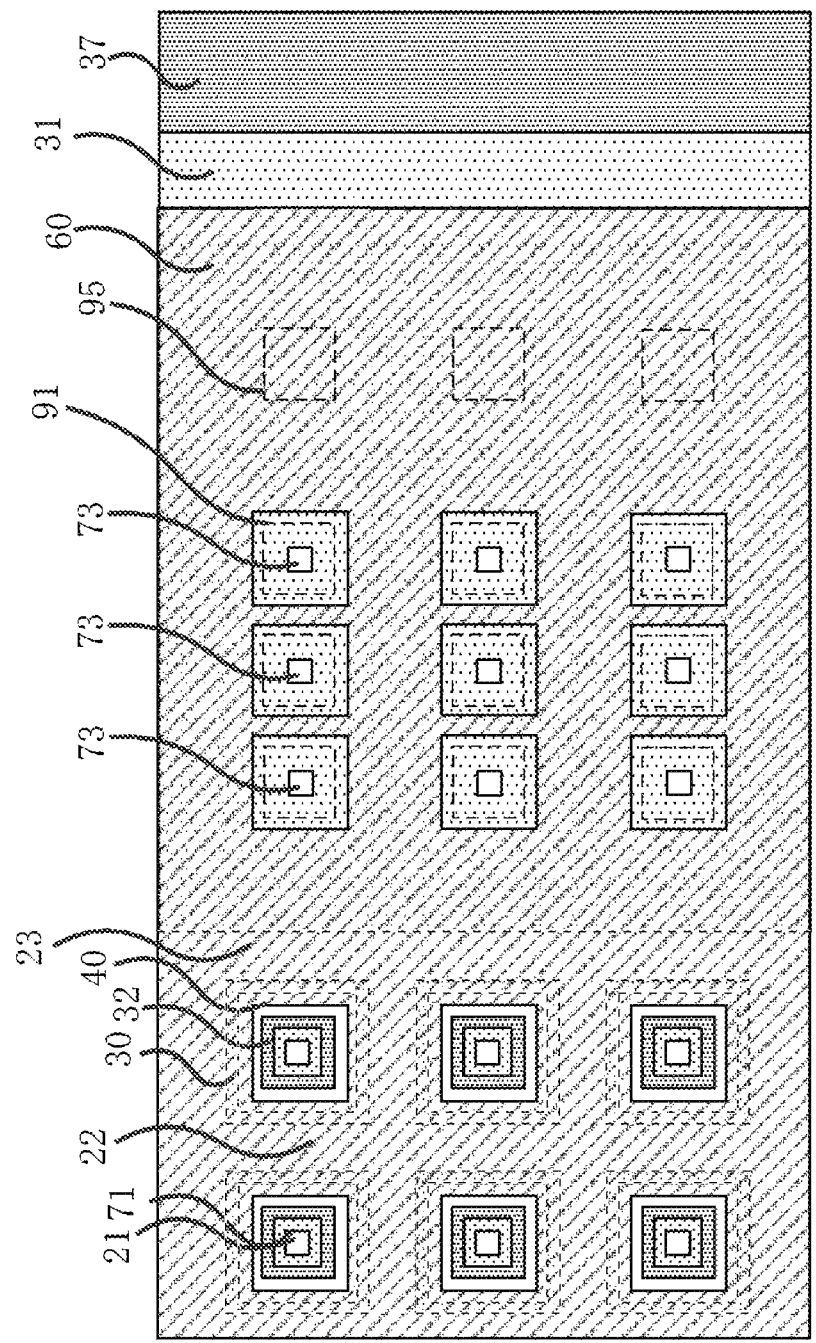
FIG. 6 is a schematic plan view of the silicon carbide semiconductor according to Embodiment 1 of this invention.

FIG. 5 is a schematic plan view of a part of the silicon carbide semiconductor device according to Embodiment 1 which mainly illustrates a structure of a semiconductor layer from the edge portion of the active region to the terminal region. FIG. 6 is a schematic plan view of a part of the silicon carbide semiconductor device according to Embodiment 1 which mainly illustrates a structure of the gate electrode 60 likewise from the edge portion of the active region to the terminal region.

As illustrated in FIGS. 5 and 6, the SBDs in the terminal region are intermittently formed in a direction along the circumference of the edge portion of the active region. As illustrated in FIG. 6, the SBDs in the terminal region are formed along a path from the gate contact holes 95 to the active region. In a region of the second well region 31 closer to the active region than a region where the gate contact holes 95 are formed, the gate electrode 60 (the bridges of the gate electrode 60) and the SBDs in the terminal region are alternately formed along the circumference of the edge portion of the active region.

Here, considering operations of causing input capacitors formed all over the active region to charge or discharge by passing the gate current flowing through the gate electrode 60 from the gate contact holes 95 to the bridges of the gate electrode 60 to flow over the wide active region, it is clear that the gate current flowing through the gate electrode 60 is denser in the bridges than in the active region if the bridges of the gate electrode 60 are as wide as the gate electrode 60 formed in the active region. This may lead to the other problems such as a failure in high-speed switching due to the limitation in the switching speed with high resistance in the bridges, and more prominently, breakdown in an element due to the heat generated in the bridges. To avoid such problems, it is preferred to widen the bridges of the gate electrode 60 more than the gate electrode 60 formed in the active region.

However, widening the bridges of the gate electrode 60 also increases the intervals between the SBDs in the terminal region which are separated by the bridges in a direction along the edge portion of the active region. Thus, the bipolar current easily passes through the edge portion in the active region which is adjacent to the bridges. Since forming a plurality of the SBDs with a termination structure along the circumferential direction of chips and forming the SBDs at a high density in the second well region 31 can increase the SBD current in the terminal region as described in Embodiment 1, the intervals between the SBDs in the terminal region which are separated in the direction along the edge portion of the active region can be designed larger while the passage of the bipolar current can be suppressed in the edge portion of the active region near the bridges of the gate electrode 60. Consequently, the bridges of the gate electrode 60 can be widened, and the high-speed switching can be implemented.

As previously described, since the distance between the SBD in the edge portion of the active region and the innermost SBD in the terminal region is larger than the interval between the SBDs in the active region, increasing the density of the SBDs in the terminal region according to, for example, a method for forming a plurality of SBDs in the circumferential direction of chips can increase the density of the SBD current in the terminal region including the bridges of the gate electrode 60 which is closer to the active region, and suppress the spread of the SBD current in the edge portion of the active region toward the periphery of the chips. Consequently, the bipolar current that is a forward current can be prevented from flowing through the p-n junction between the first well regions 30 in the edge portion of the active region and the drift layer 20. Moreover, the expansion of the stacking faults in the p-n junction and reduction in the breakdown voltage due to this expansion of the stacking faults can be suppressed.

As illustrated in FIGS. 5 and 6, the intervals between the second Schottky electrodes 73 in the terminal region are shorter than the intervals between the first Schottky electrodes 71 in the active region. Furthermore, the second Schottky electrodes 73 in the terminal region are denser than the first Schottky electrodes 71 in the active region.

Likewise, the intervals between the fourth separation regions 24 in the terminal region are shorter than the intervals between the first separation regions 21 in the active region. Furthermore, fourth separation regions 24 in the terminal region are denser than the first separation regions 21 in the active region.

Furthermore, the intervals between the SBDs in the terminal region are shorter than the intervals between the SBDs in the active region. The SBDs in the terminal region are denser than the SBDs in the active region.

Here, the second Schottky electrodes 73, the fourth separation regions 24, and the SBDs in the terminal region should be as dense as those in the second well region 31 in the terminal region, and further as dense as those from a region of the second well region 31 above which the gate contact holes 95 are formed to a region closer to the active region.

Figure 7:
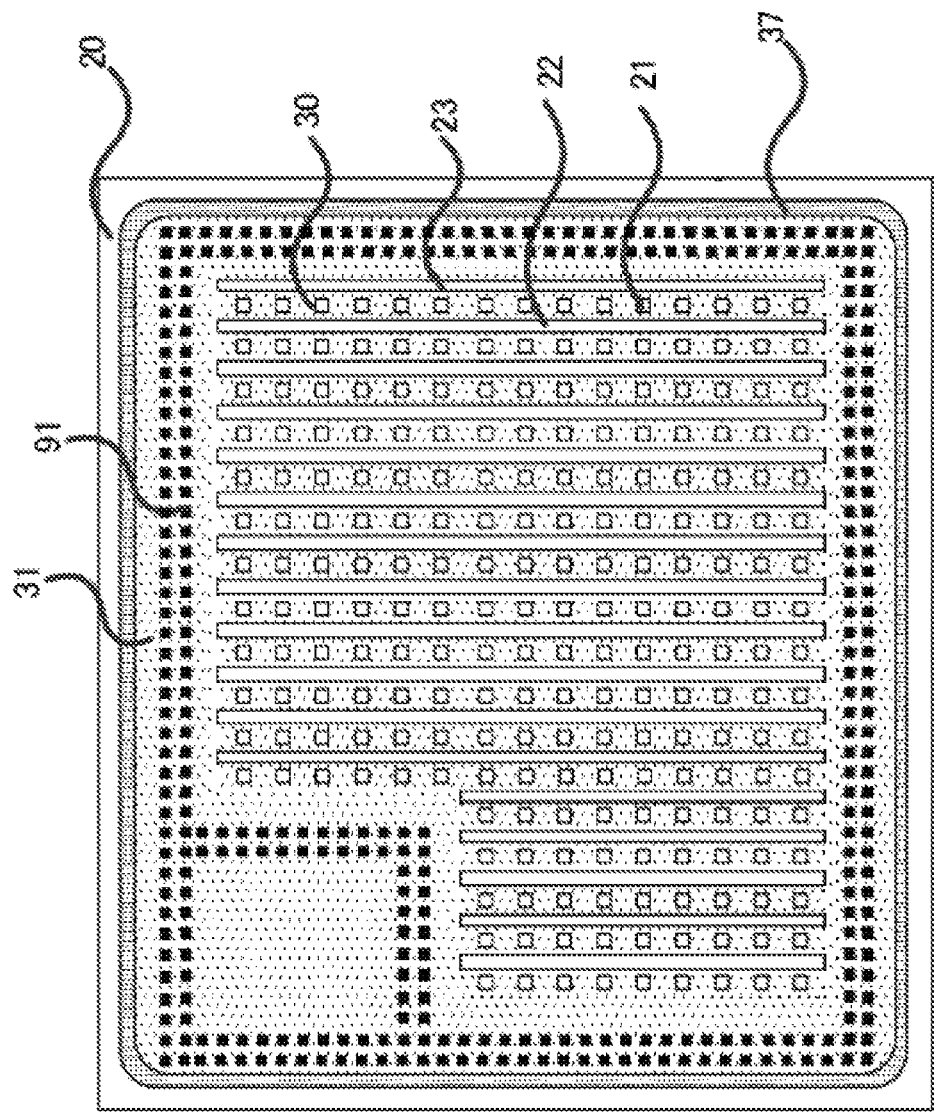
FIG. 7 is a schematic plan view of a silicon carbide semiconductor device with another structure according to Embodiment 1 of this invention.

Although Embodiment 1 describes that the first well regions 30 are separated from the second well region 31, the first well regions 30 may be connected to the second well region 31. Furthermore, although Embodiment 1 describes the plurality of first well regions 30 that are separated from each other, the first well regions 30 may be connected to each other. FIG. 7 is a schematic plan view when the first well regions 30 are connected to the second well region 31 and the first well regions 30 are connected to each other.

Here, each of the first well regions 30 is at a distance of 50 μm or less either from the source region 40 in the first well region 30 or from the first Schottky electrode 71 formed on the first separation region 21 in the first well region 30.

Figure 8:
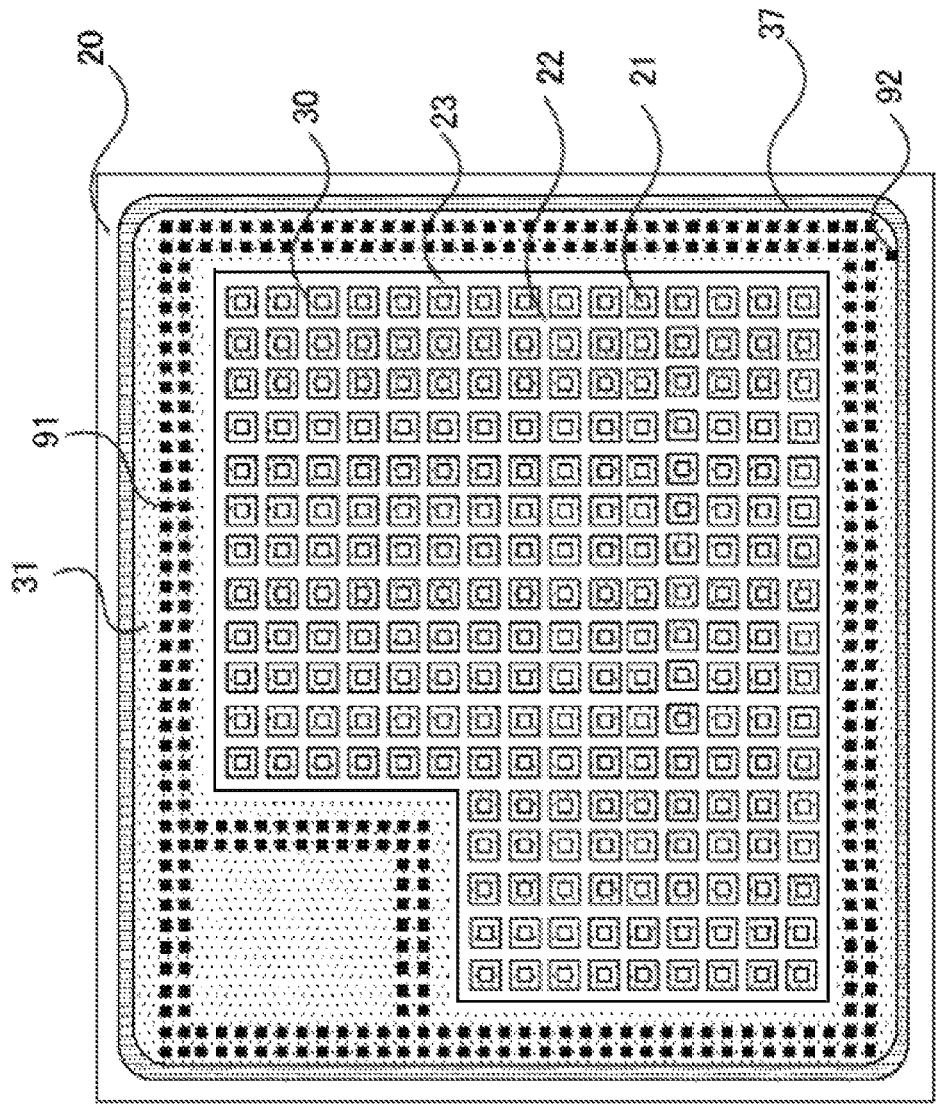
FIG. 8 is a schematic plan view of a silicon carbide semiconductor device with another structure according to Embodiment 1 of this invention.
Figure 9:
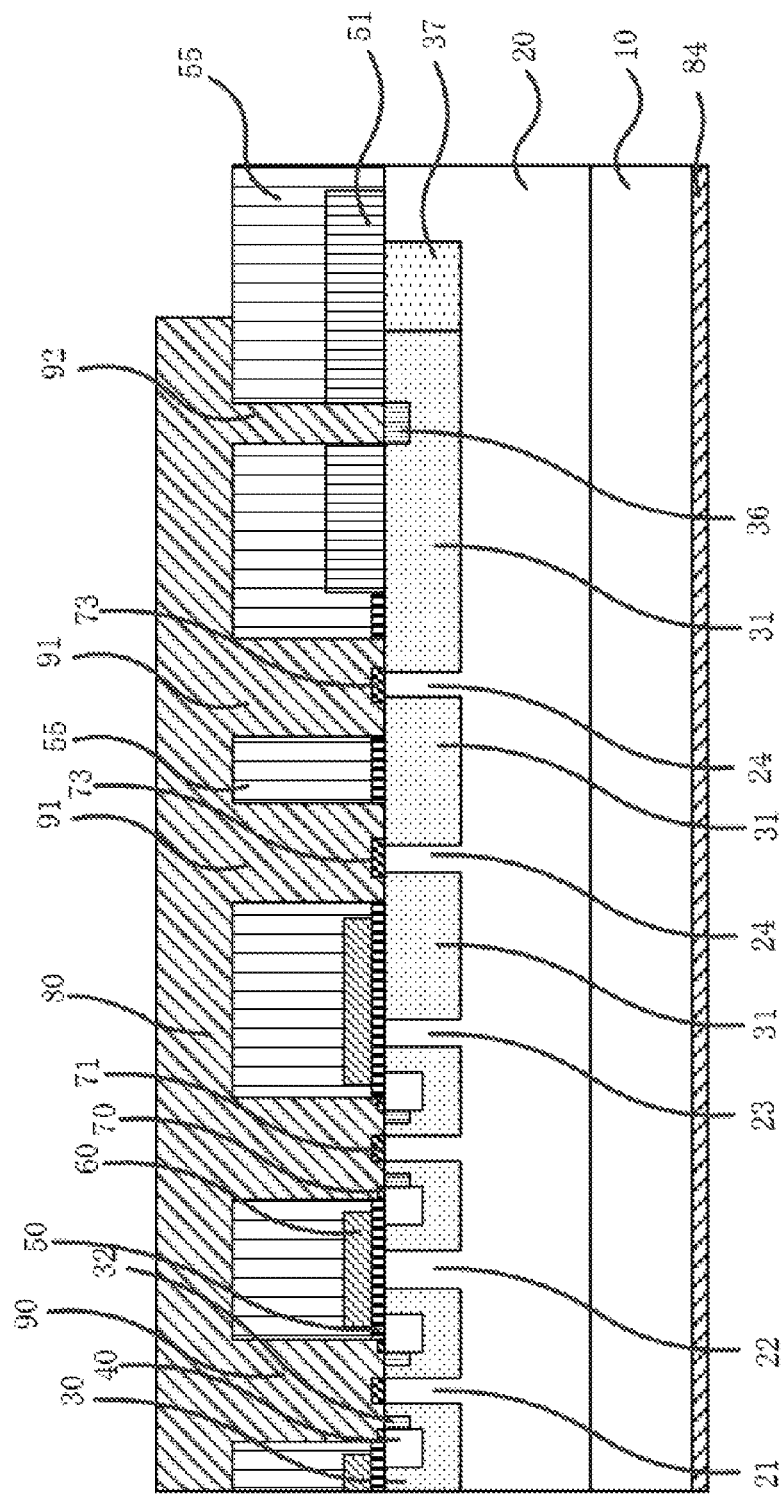
FIG. 9 is a schematic sectional view of a silicon carbide semiconductor device with another structure according to Embodiment 1 of this invention.

FIG. 8 is a schematic plan view mainly illustrating a silicon carbide semiconductor portion in the silicon carbide semiconductor device with another feature according to Embodiment 1. In FIG. 8, a second-well-region contact hole 92 having an ohmic connection to the second well region 31 and the source electrode 80 is formed in a portion of the second well region 31. FIG. 9 is a schematic sectional view illustrating a cross section including the portion in which the second-well-region contact hole 92 in FIG. 8 is formed. In FIG. 9, the second-well-region contact hole 92 is formed through the field insulating film 51 and the interlayer insulating film 55. The second well region 31 under the second-well-region contact hole 92 may have a second well contact region 36 higher in p-type impurity concentration and lower in resistance than the second well region 31.

The second-well-region contact hole 92 is formed on the shortest path in the second well region 31 at a distance of 10 μm or more from the second contact hole 91 in the cross-lateral direction. Here, a portion in the second well region 31 at a distance of 10 μm or more from the second-well-region contact hole 92 is regarded as having substantially a non-ohmic connection. More preferably, the distance between the second contact hole 91 and the second-well-region contact hole 92 on the shortest path in the second well region 31 should be 50 μm or more.

Figure 10:
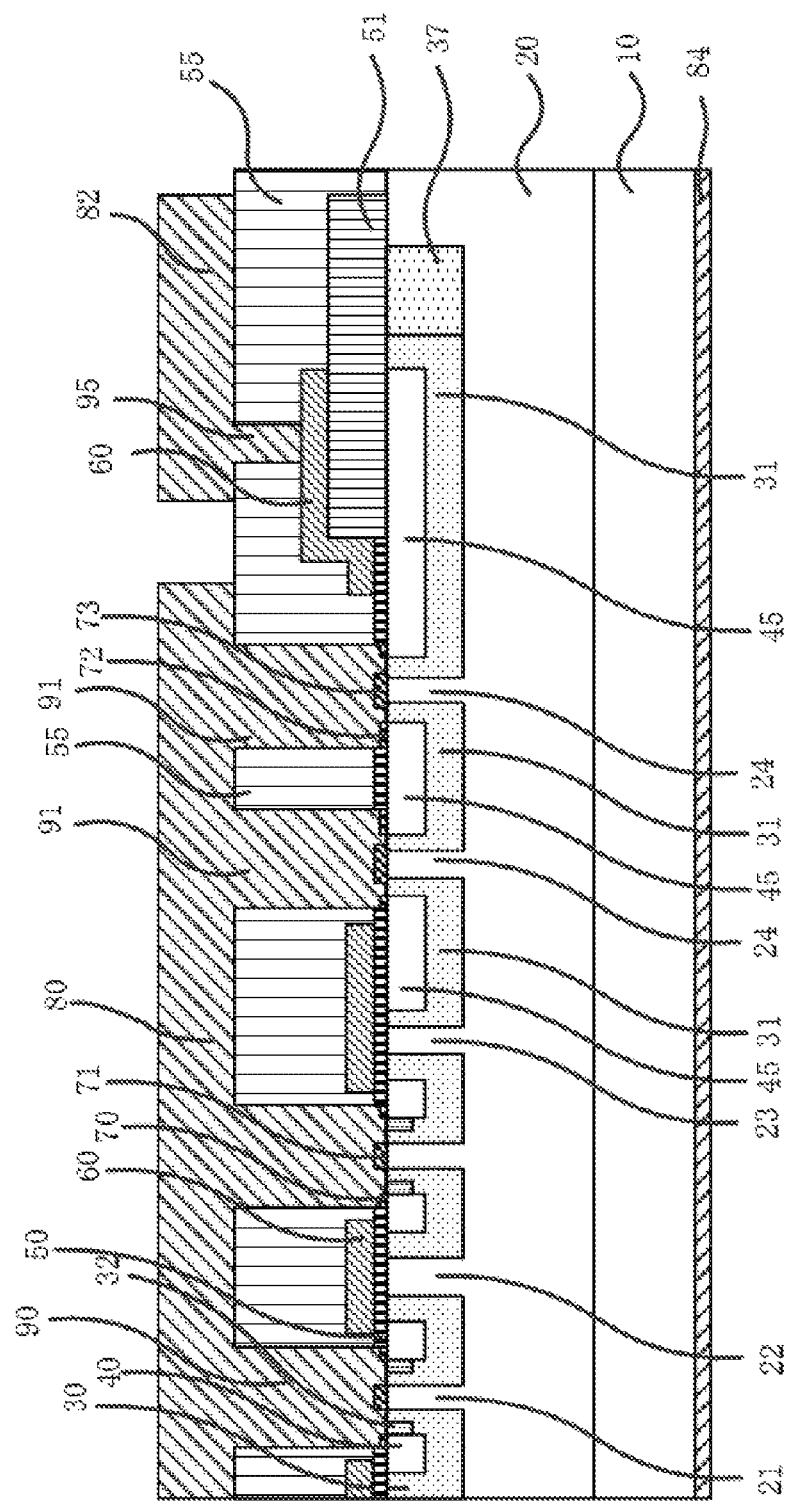
FIG. 10 is a schematic sectional view of a silicon carbide semiconductor device with another structure according to Embodiment 1 of this invention.
Figure 11:
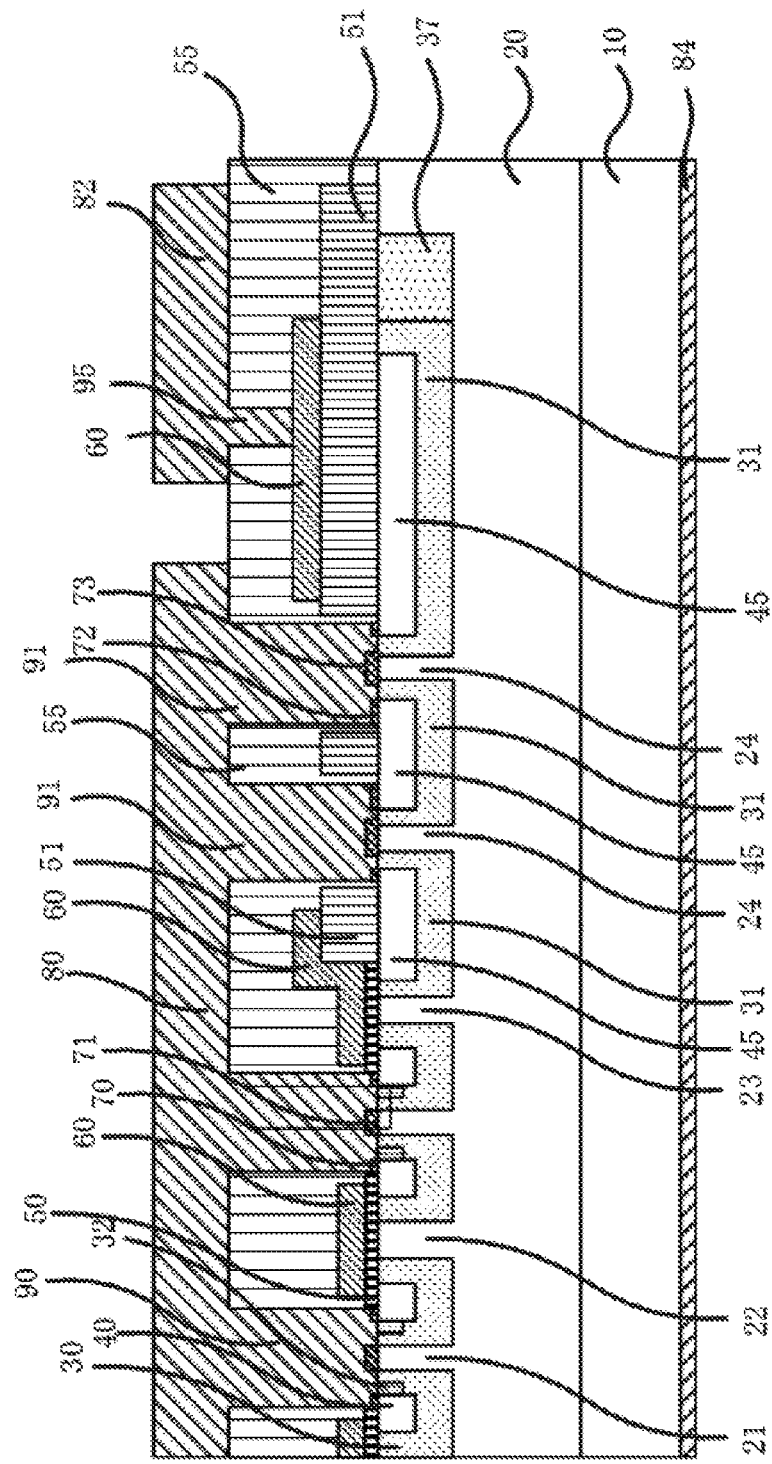
FIG. 11 is a schematic sectional view of a silicon carbide semiconductor device with another structure according to Embodiment 1 of this invention.
Figure 12:
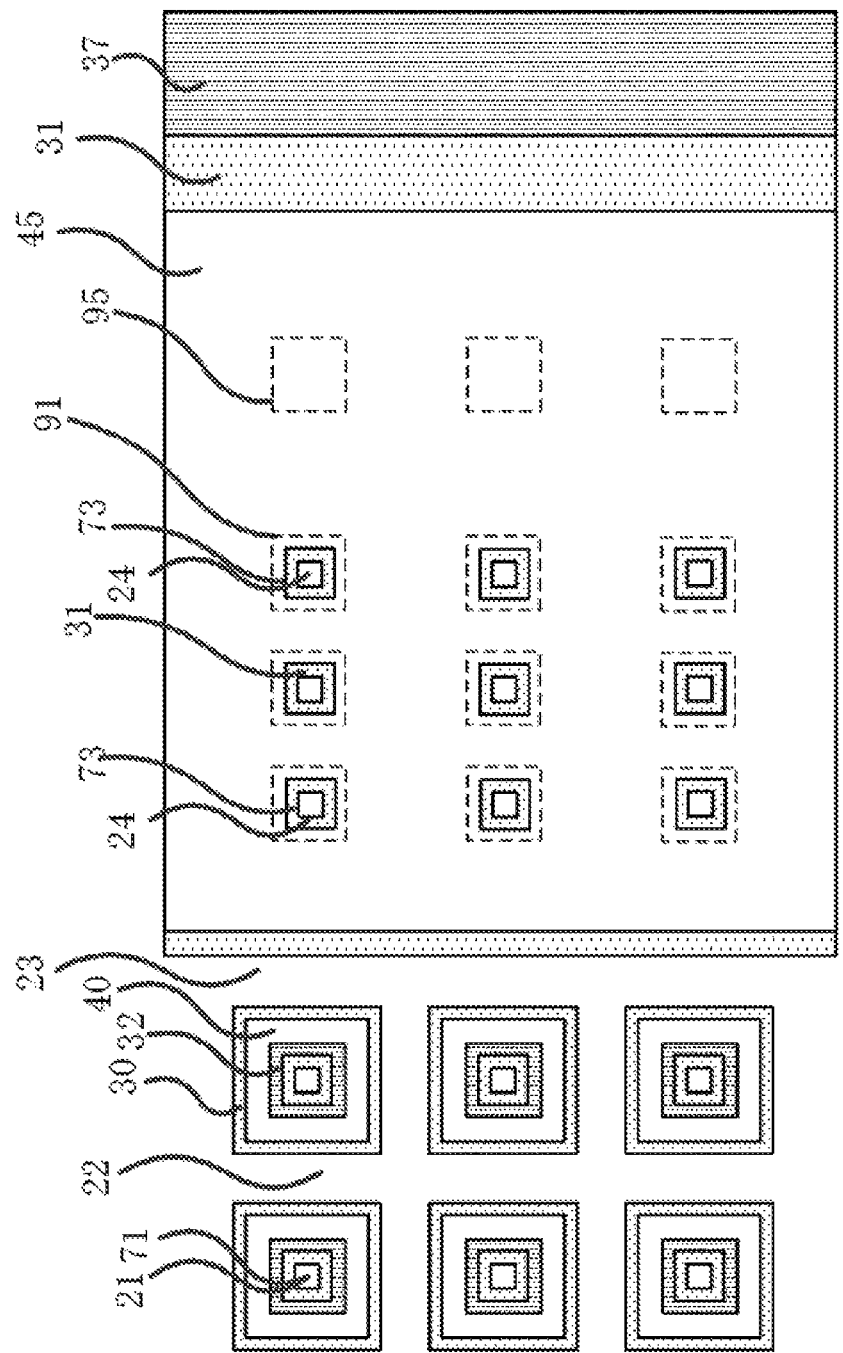
FIG. 12 is a schematic plan view of a silicon carbide semiconductor device with another structure according to Embodiment 1 of this invention.

FIGS. 10 and 11 are schematic sectional views illustrating a portion of a silicon carbide semiconductor with a feature different from that of the silicon carbide semiconductor device according to Embodiment 1. FIGS. 10 and 11 are identical to FIGS. 2 and 4, respectively, in all respects other than forming, in a part of the surface layer of the second well region 31, a silicon carbide conductive layer 45 of the first conductivity type and an ohmic electrode 72 having an ohmic connection to the silicon carbide conductive layer 45 and the source electrode 80. FIG. 12 is a schematic plan view for describing a region in which the silicon carbide conductive layer 45 formed in the silicon carbide semiconductor device illustrated in the schematic sectional views of FIGS. 10 and 11 is formed.

Since the silicon carbide conductive layer 45 of the first conductivity type is formed partly in the surface layer of the second well region 31 in the silicon carbide semiconductor device according to Embodiment 1, the resistance of the second well region 31 in a plane lateral direction and a voltage generated by a displacement current flowing through the second well region 31 when the silicon carbide semiconductor device is turned ON/OFF can be reduced in addition to the aforementioned advantages. Thus, the reliability can be enhanced more significantly.

Figure 13:
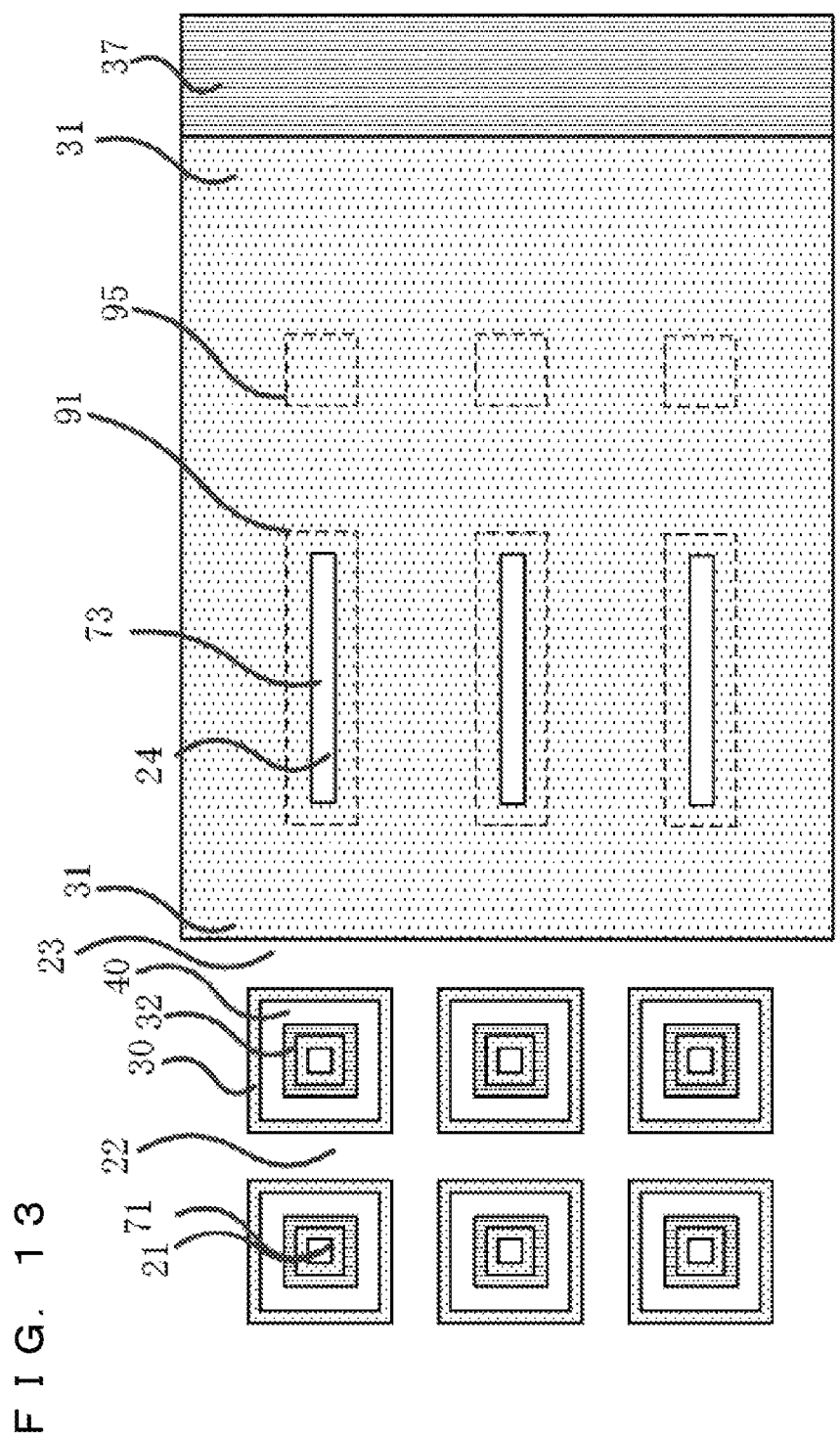
FIG. 13 is a schematic plan view of a silicon carbide semiconductor device with another structure according to Embodiment 1 of this invention.
Figure 14:
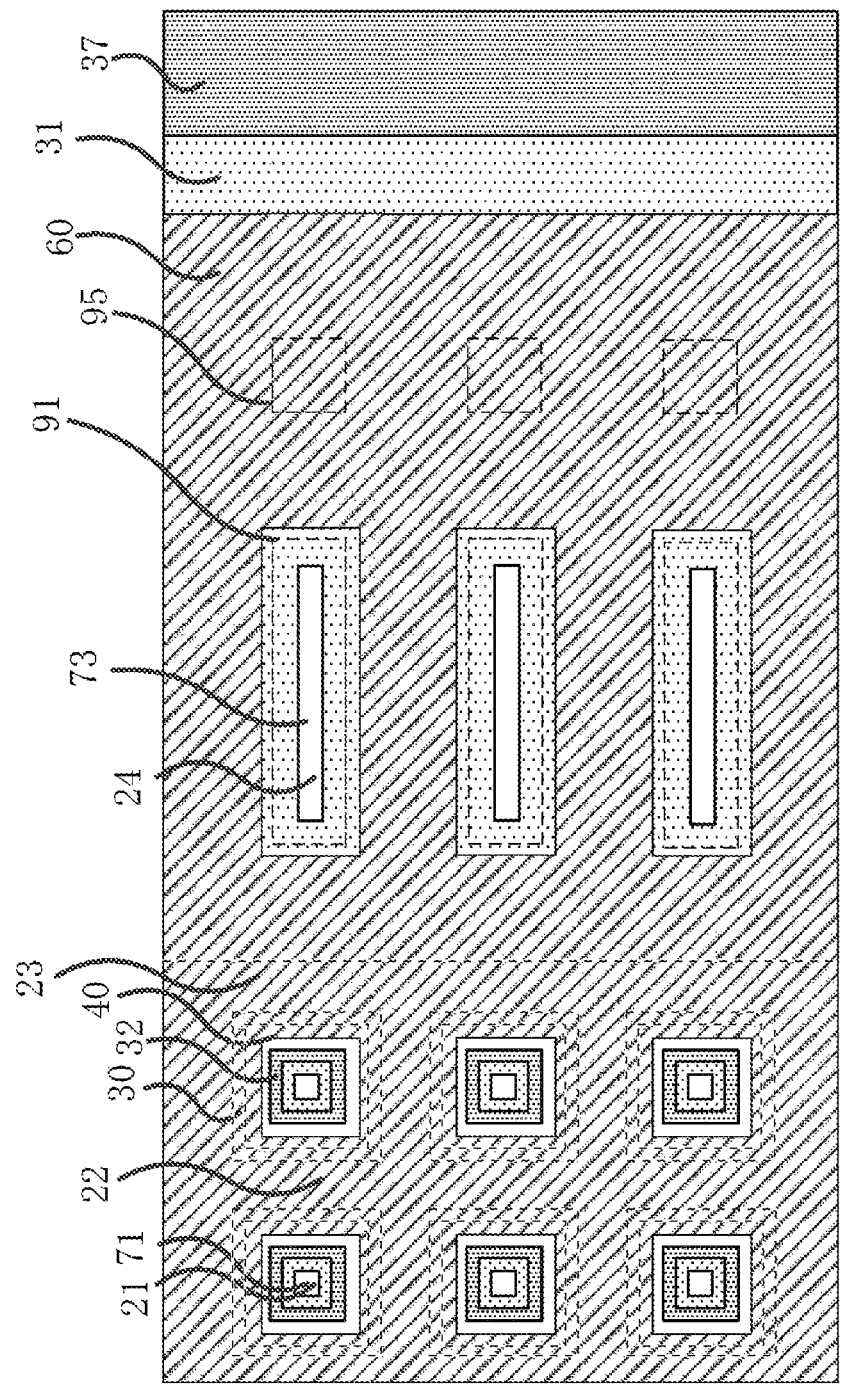
FIG. 14 is a schematic plan view of a silicon carbide semiconductor device with another structure according to Embodiment 1 of this invention.
Figure 15:
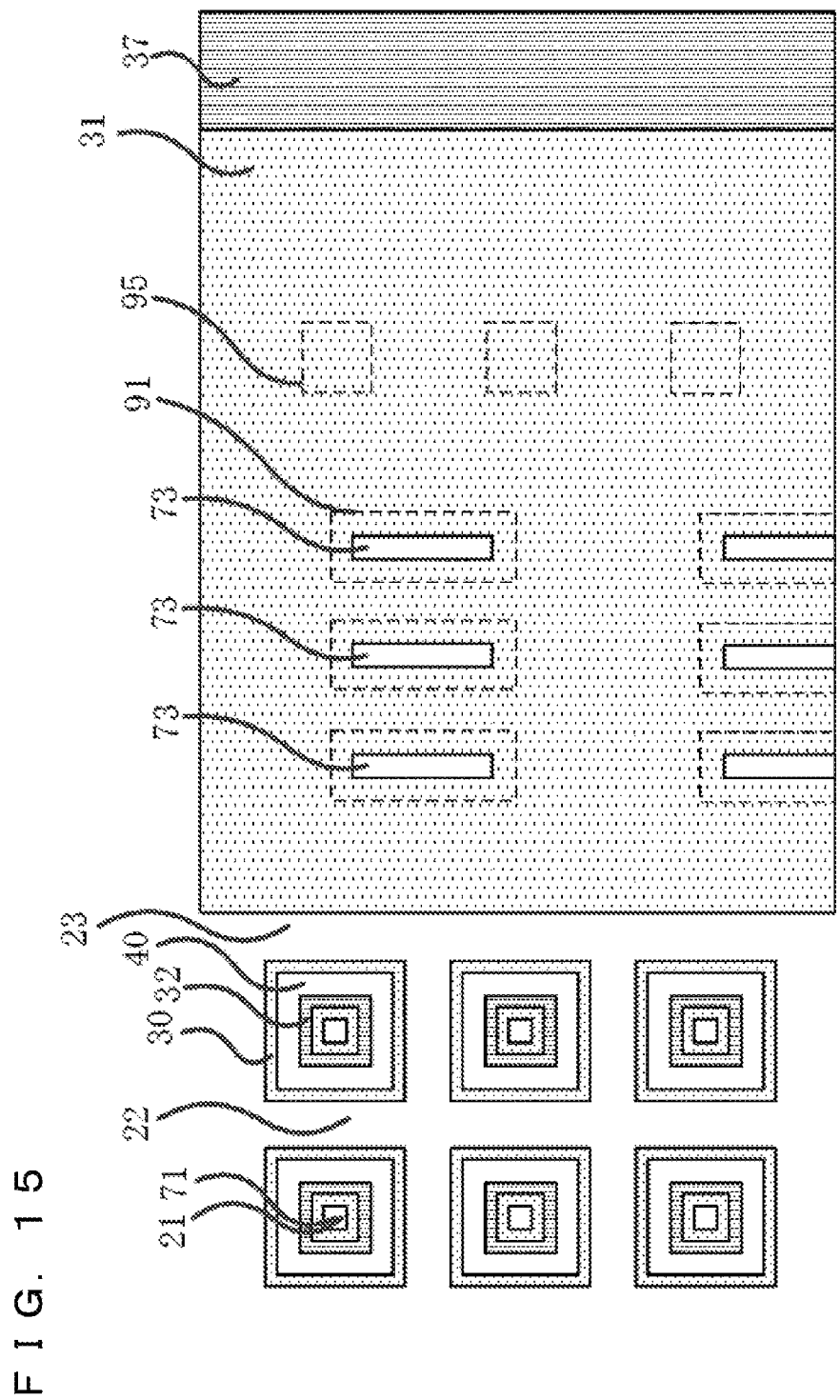
FIG. 15 is a schematic plan view of a silicon carbide semiconductor device with another structure according to Embodiment 1 of this invention.
Figure 16:
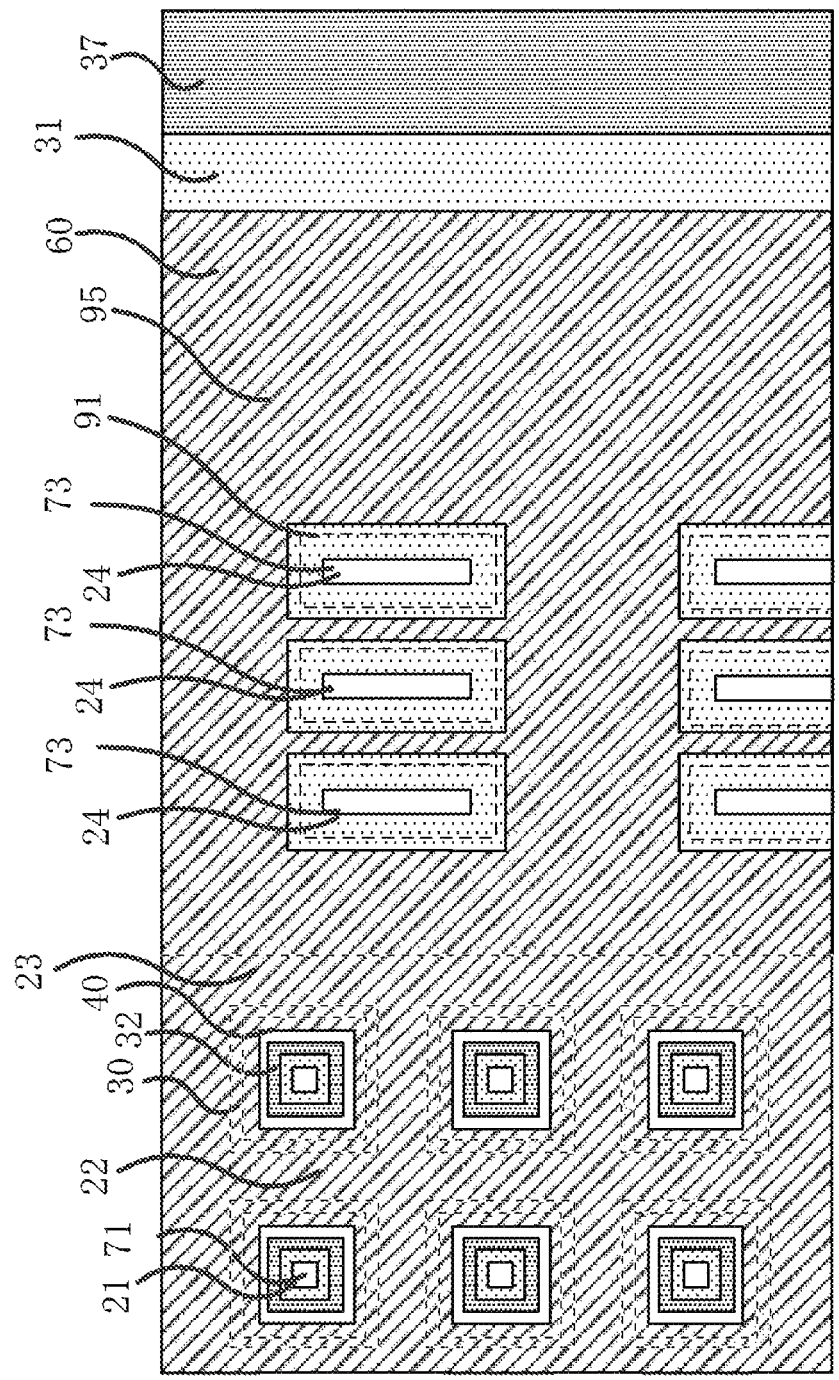
FIG. 16 is a schematic plan view of a silicon carbide semiconductor device with another structure according to Embodiment 1 of this invention.

Although the fourth separation regions 24 and the second Schottky electrodes 73 all of which are square as a planar shape are arranged from the active region toward the periphery of chips in the described examples, this planar shape and the arrangement method are arbitrary. For example, the fourth separation regions 24 and the second Schottky electrodes 73 may be formed into a plurality of stripes in the circumferential direction of chips as planar shapes as illustrated in the respective structures of the semiconductor layer and the gate electrode 60 in FIGS. 13 and 14. Further, the fourth separation regions 24 and the second Schottky electrodes 73 may be formed into a plurality of stripes in a direction orthogonal to the circumferential direction of chips as the planar shapes as illustrated in the respective structures of the semiconductor layer and the gate electrode 60 in FIGS. 15 and 16.

Although the ion implantation is performed in a predetermined order in the examples described in Embodiment 1, the order of the ion implantation may be changed where appropriate. Further, the order of forming the ohmic electrode on the rear surface, and the ohmic electrodes 70, the first Schottky electrodes 71, and the second Schottky electrodes 73 on the front surface may be changed where appropriate.

Although the first Schottky electrodes 71 are formed only on the first separation regions 21 and the first well regions 30 and the second Schottky electrodes 73 are formed only on the fourth separation regions 24 and the second well region 31 in the examples described in Embodiment 1, they may be formed on the ohmic electrodes 70 or the interlayer insulating film 55.

Although Embodiment 1 is described based on the planar type in which the channel region or the Schottky electrode surface is formed parallel to the wafer plane, Embodiment 1 is also applicable to the trench type in which the channel region or the Schottky electrode surface is formed diagonal or vertical to the wafer plane. Here, the surfaces defined in this DESCRIPTION include not only the wafer plane but also the surface on which a trench is formed.

Although the first separation regions 21 are of n-type as the drift layer 20 and have the same impurity concentration as that of the drift layer 20 according to Embodiment 1, the first separation regions 21 may be higher in n-type impurity concentration than the drift layer 20. These details on the first separation regions 21 also apply to the second separation regions 22 and the fourth separation regions 24.

Although described is that the first conductivity type and the second conductivity type are n-type and p-type, respectively, and that they may be reversed, handling the first conductivity type as n-type and the second conductivity type as p-type produces more advantages.

Embodiment 2

Although the SBD formed in the second well region 31 in the terminal region of the silicon carbide semiconductor device according to Embodiment 1 includes the second Schottky electrode 73 and the fourth separation region 24 in the second contact hole 91, the second contact hole 91 and the second Schottky electrode 73 are formed across the plurality of fourth separation regions 24 in the SBDs formed in the well region in the terminal region of the silicon carbide semiconductor device according to Embodiment 2 where the intervals between the fourth separation regions 24 are shorter than those between the first separation regions 21 in the active region. Since the other features are the same as those according to Embodiment 1, the detailed description will be omitted.

Figure 17:
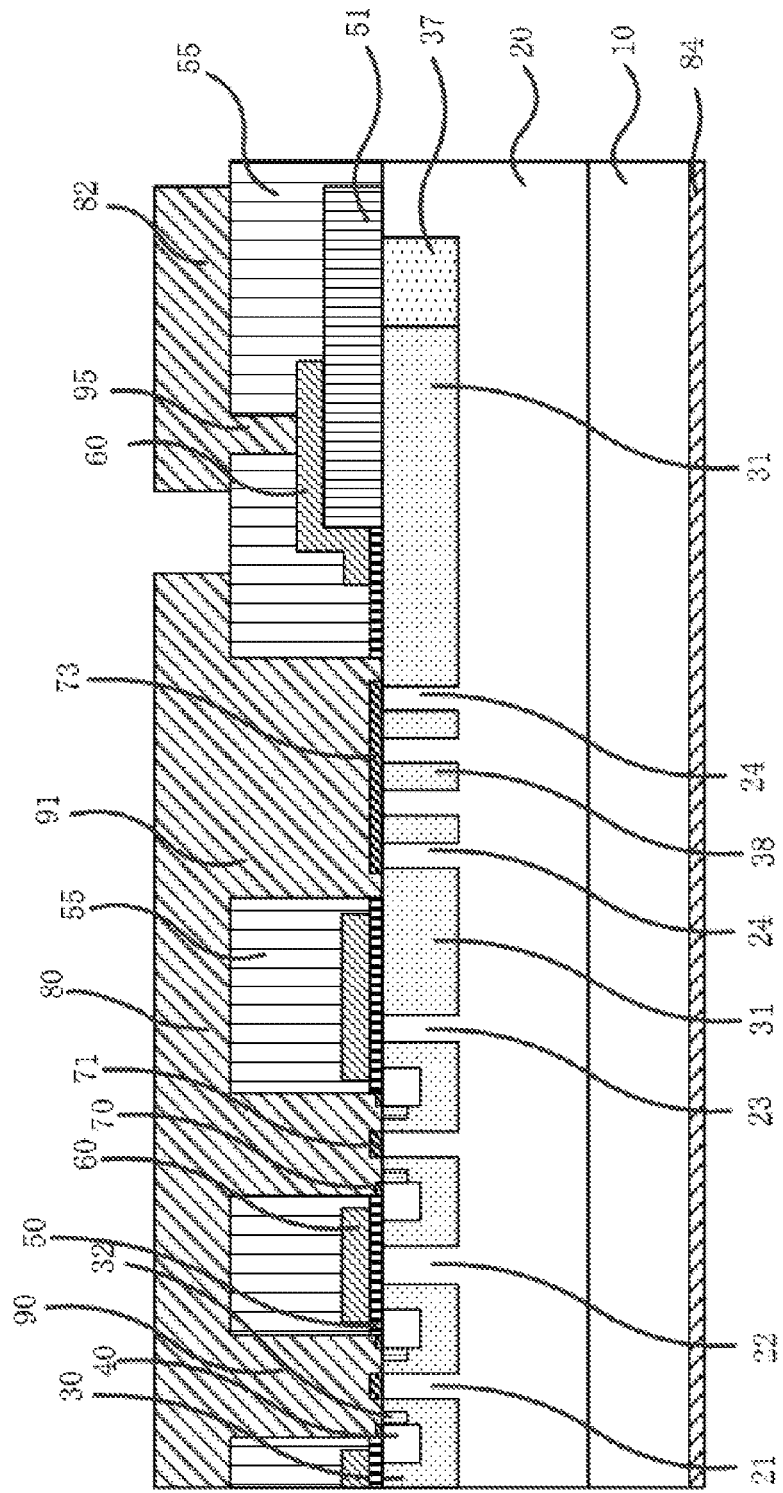
FIG. 17 is a schematic sectional view of the silicon carbide semiconductor device according to Embodiment 2 of this invention.
Figure 18:
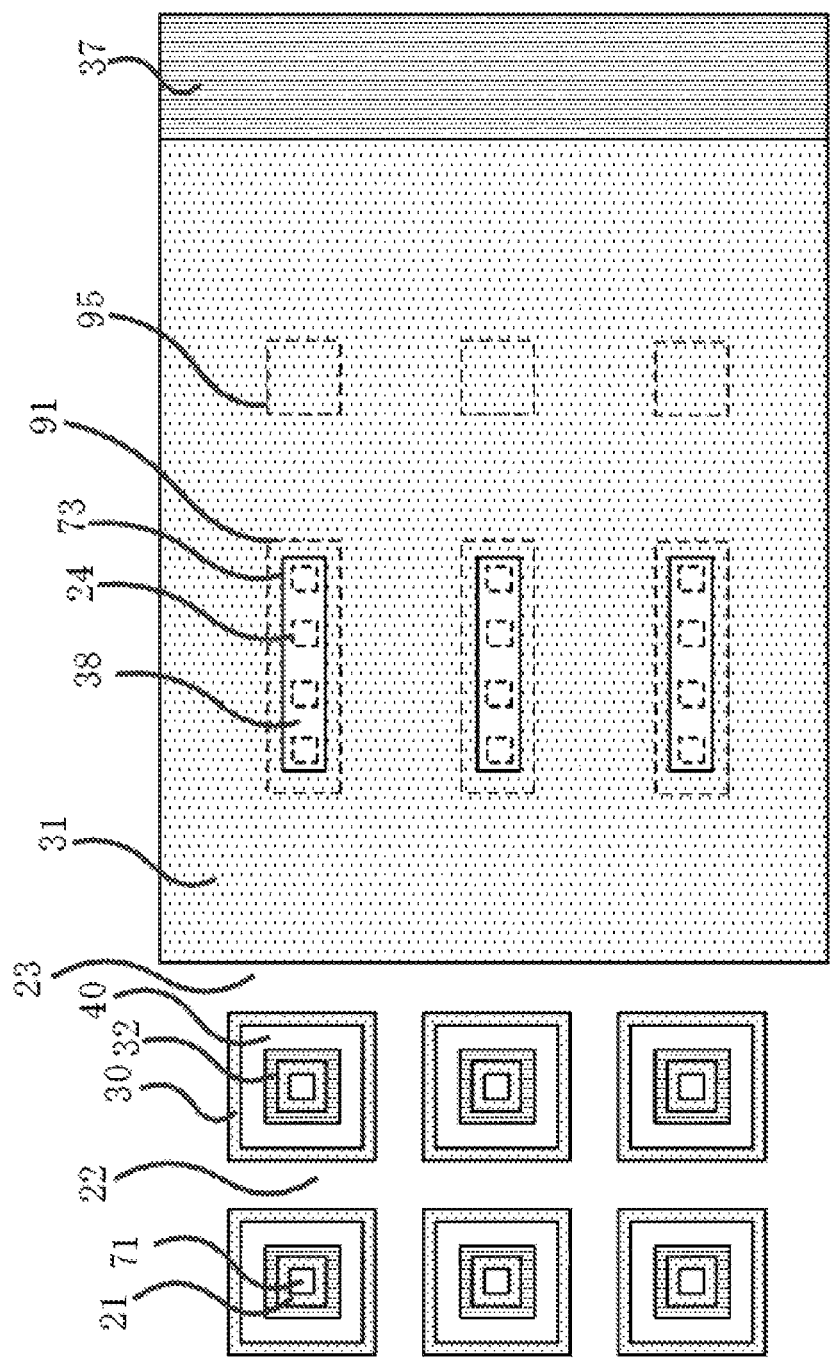
FIG. 18 is a schematic plan view of the silicon carbide semiconductor according to Embodiment 2 of this invention.

FIG. 17 is a schematic sectional view of the silicon carbide semiconductor device according to Embodiment 2 schematically illustrating a cross section corresponding to the line a-a' from the source electrode 80 to the gate line 82 on the periphery of the silicon carbide semiconductor device described with reference to FIG. 1 according to Embodiment 1. FIG. 18 is a schematic plan view mainly illustrating the semiconductor layer in the same region.

In the terminal region of the silicon carbide semiconductor device illustrated in FIGS. 17 and 18 according to Embodiment 2, the plurality of fourth separation regions 24 of the first conductivity type that are made of silicon carbide are formed inside the plane of the second well region 31 of the second conductivity type. Regions between the fourth separation regions 24 are auxiliary regions 38 of the second conductivity type that is identical to that of the second well region 31. The second Schottky electrode 73 forming a Schottky connection with the fourth separation regions 24 and the auxiliary regions 38 between the fourth separation regions 24 is formed on the fourth separation regions 24. The second contact hole 91 is formed to include the second Schottky electrode 73 and the plurality of fourth separation regions 24 formed under the second Schottky electrode 73 and to penetrate through the gate insulating film 50 or the field insulating film 51 and the interlayer insulating film 55. The source electrode 80 is formed inside the second contact holes 91 so as to be in contact with the second well region 31 and the second Schottky electrodes 73.

A method for manufacturing the silicon carbide semiconductor device according to Embodiment 2 is identical to that according to Embodiment 1. The second Schottky electrodes 73, the fourth separation regions 24, and the second contact holes 91 should be formed by merely changing the mask pattern.

In the silicon carbide semiconductor device according to Embodiment 2, the number of divisions of the second contact holes 91 and the second Schottky electrodes and the intervals between the fourth separation regions 24 can be reduced while the advantages similar to those of the silicon carbide semiconductor device according to Embodiment 1 are produced.

Thus, the density of the SBDs in the second well region 31 can be more increased, and the SBD current of higher density can be applied. Consequently, the passage of the bipolar current in the edge portion of the active region can be more significantly suppressed.

Here, the second Schottky electrode 73 is in contact with the auxiliary regions 38 that partition the fourth separation regions 24. When the auxiliary regions 38 of the second conductivity type are connected to the second well region 31 in a planar view and the second Schottky electrodes 73 electrically connected to the source electrode 80 have an ohmic connection to the auxiliary regions 38, the second well region 31 also has an ohmic connection to the source electrode 80. Thus, suppression of the passage of the bipolar current to the second well region 31, which is the advantage of the present invention, cannot be implemented. Thus, the second Schottky electrodes 73 according to the present invention have Schottky characteristics not only for the fourth separation regions 24 but also for the second well region 31 and the auxiliary regions 38. To implement this, the surface concentration of the second well region 31 that is in contact with the auxiliary regions 38 and the second Schottky electrodes 73 is preferably lower than or equal to $1\times10^{19}$ cm$^{-3}$, and is more preferably lower than or equal to $1\times10^{18}$ cm$^{-3}$.

If the second well region 31 that is in contact with the auxiliary regions 38 and the second Schottky electrodes 73 has less surface density of impurities (a sum of volume densities in a depth direction), the depletion electric field is not completely terminated in an OFF state, such that the interfaces between the SBDs in the terminal region are subjected to a high electric field. This may increase the Schottky leakage current, increase the heat generated in the chips, or worsen the reliability of elements. Thus, the second well region 31 that is in contact with the auxiliary regions 38 and the second Schottky electrodes 73 preferably has a retrograde profile in which the concentration of impurities of the second conductivity type peaks in a region deeper than the surface.

Embodiment 3

Although Embodiment 2 describes an example where the auxiliary regions 38 are connected to the second well region 31, ground auxiliary regions 39 are formed instead of the auxiliary regions 38 according to Embodiment 3. The ground auxiliary regions 39 are not connected to the second well region 31, the second well region 31 has a non-ohmic connection to the source electrode 80, and the ground auxiliary regions 39 have an ohmic connection to the source electrode 80. Further, the fourth separation regions 24 of n-type are formed inside or between the ground auxiliary regions 39. Since the other features are the same as those according to Embodiments 1 and 2, the detailed description will be omitted.

Figure 19:
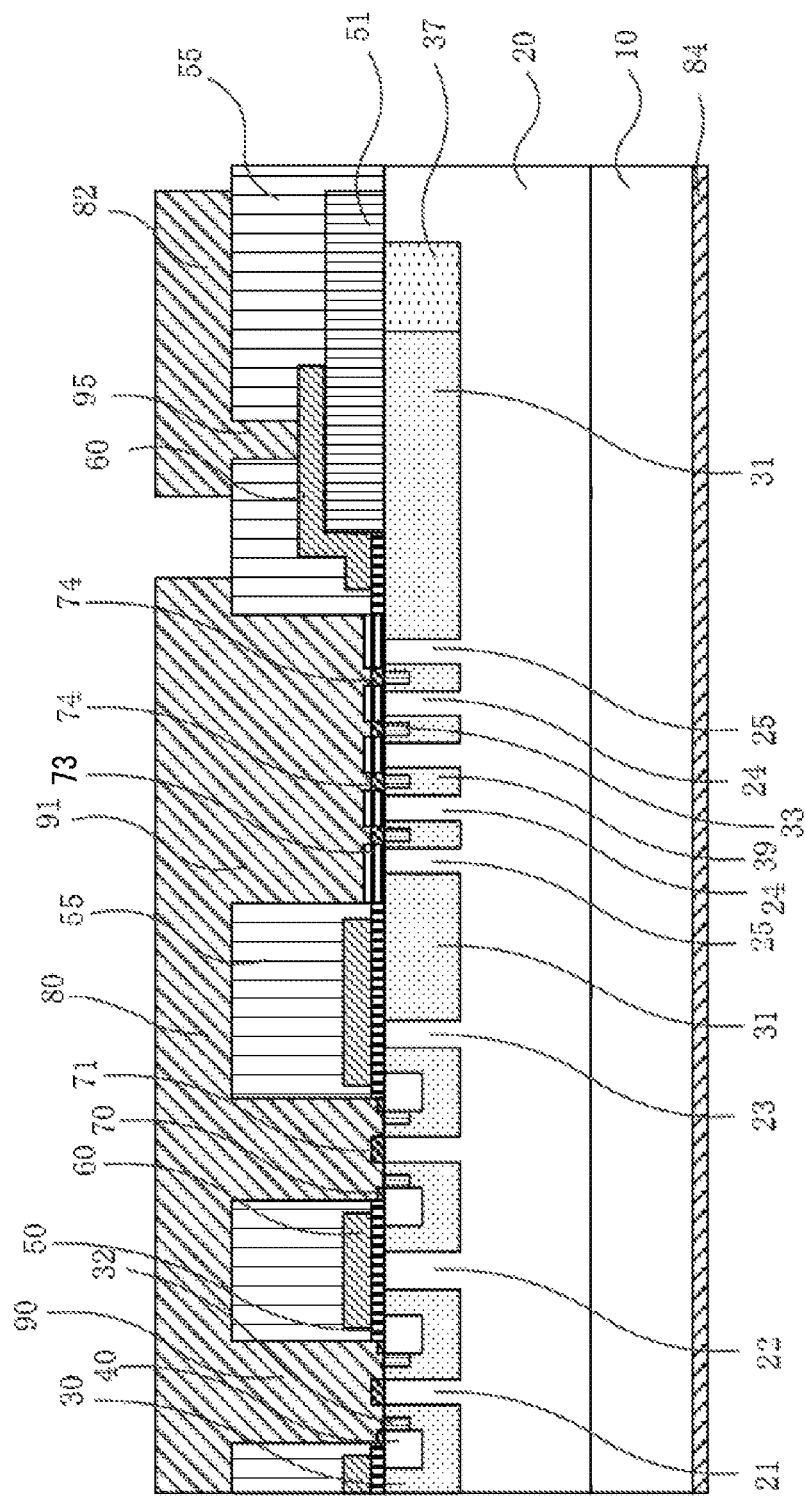
FIG. 19 is a schematic sectional view of the silicon carbide semiconductor device according to Embodiment 3 of this invention.
Figure 20:
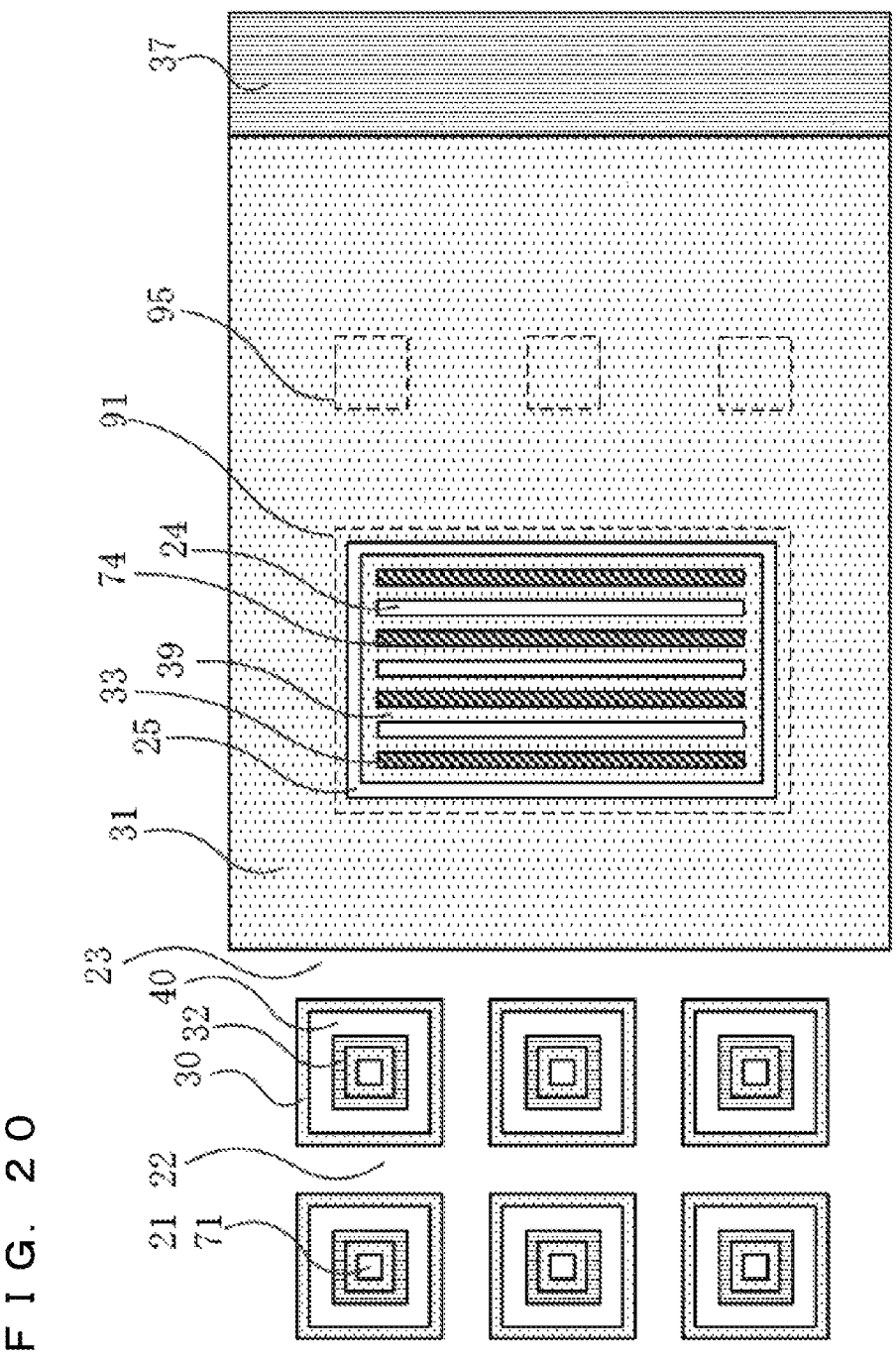
FIG. 20 is a schematic plan view of the silicon carbide semiconductor according to Embodiment 3 of this invention.

FIG. 19 is a schematic sectional view of the silicon carbide semiconductor device according to Embodiment 3 schematically illustrating a cross section corresponding to the line a-a' from the source electrode 80 to the gate line 82 on the periphery of the silicon carbide semiconductor device described with reference to FIG. 1 according to Embodiment 1. FIG. 20 is a schematic plan view mainly illustrating the semiconductor layer in the same region.

As illustrated in FIGS. 19 and 20, the ground auxiliary regions 39 are separated from the second well region 31 both in the planar view and in the sectional view of the silicon carbide semiconductor device according to Embodiment 3. A fifth separation region 25 of n-type is formed between the ground auxiliary regions 39 and the second well region 31. The second Schottky electrode 73 across the ground auxiliary regions 39 and the second well region 31 is formed on the fifth separation region 25. Further, second contact regions 33 made of silicon carbide of low resistance and p-type are formed in the silicon carbide surface of the ground auxiliary regions 39. Second ohmic electrodes 74 are formed on the surface of the second contact regions 33 and the ground auxiliary regions 39. The ground auxiliary regions 39 have an ohmic connection to the source electrode 80.

Further, the fourth separation regions 24 are formed inside or between the ground auxiliary regions 39. The second Schottky electrode 73 forms a Schottky connection with the fourth separation regions 24 and the fifth separation region 25.

The fifth separation region 25 is of n-type similarly to the drift layer 20, and has the same impurity concentration as that of the drift layer 20. The fifth separation region 25 may be higher in n-type impurity concentration than the drift layer 20.

Although the ground auxiliary regions 39 have an ohmic connection to the source electrode 80 in the silicon carbide semiconductor device according to Embodiment 3, the fifth separation region 25 and the fourth separation regions 24 are formed in the vicinity of the ground auxiliary regions 39 at the intervals shorter than those of the first separation regions 21 in the active region. Thus, allowing a sufficient SBD current to pass through the drift layer 20 that is a layer under the ground auxiliary regions 39 can avoid the bipolar current from flowing through the p-n junction formed between the ground auxiliary regions 39 and the drift layer 20.

As previously described the ground auxiliary regions 39 are separated from the second well region 31 both in the planar view and in the sectional view. In addition, the second Schottky electrode 73 across the ground auxiliary regions 39 and the second well region 31 has the respective Schottky contacts with the ground auxiliary regions 39 and the second well region 31. Thus, the ground auxiliary regions 39 are electrically separated from the second well region 31. Since the second well region 31 has a non-ohmic connection to the source electrode 80 as described in Embodiments 1 and 2, the bipolar current can be prevented from flowing from the second well region 31 during the free-wheeling operations.

Since the ground auxiliary regions 39 have an ohmic connection to the source electrode 80 according to Embodiment 3, the ground auxiliary regions 39 are not charged up during the free-wheeling operations. The depletion layer does not spread out over the fifth separation region 25 and the fourth separation regions 24 adjacent to the ground auxiliary regions 39 from the ground auxiliary regions 39 side. Thus, a larger SBD current can be applied to the second Schottky electrode 73 through the fourth separation regions 24 and the fifth separation region 25 than that when the ground auxiliary regions 39 are in a floating state. Consequently, the passage of the bipolar current in the edge portion of the active region can be more significantly suppressed.

According to Embodiment 3, the ground auxiliary regions 39, the fourth separation regions 24, the fifth separation region 25, the second ohmic electrodes 74, and the second contact regions 33 are formed in the second contact holes 91 that is a single contact hole. This structure can reduce an area occupied in a plane direction and suppress increase in size of elements more than those when this structure is formed using a plurality of contact holes.

Although both the second contact regions 33 and the second ohmic electrodes 74 are formed so that the ground auxiliary regions 39 have an ohmic connection to the source electrode 80 in the example described in Embodiment 3, the ground auxiliary regions 39 may have an ohmic connection to the source electrode 80 when only the second contact regions 33 or the second ohmic electrodes 74 are formed.

Further, the second contact regions 33 and the contact regions 32 in the active region may be formed simultaneously through the same ion implantation process to give the same impurity concentration. Similarly, the second ohmic electrodes 74 may be formed with the ohmic electrodes 70 in the active region through the same processes using, for example, a silicide.

Forming the second contact regions 33 and the contact regions 32 or the second ohmic electrodes 74 and the ohmic electrodes 70 through the respective same processes can reduce the manufacturing cost.

Embodiment 4

Embodiments 1 to 3 mainly describe, in principle in the terminal region of the silicon carbide semiconductor device, that the second well region 31 with the termination structure is separated from the first well regions 30 in the active region and that the second well region 31 has a non-ohmic connection to the source electrode 80. In Embodiment 4, the second well region 31 with the termination structure is partly connected to the first well regions 30 through auxiliary connection regions 34. Since the other structures are the same as those according to Embodiments 1 to 3, the detailed description will be omitted.

Figure 21:
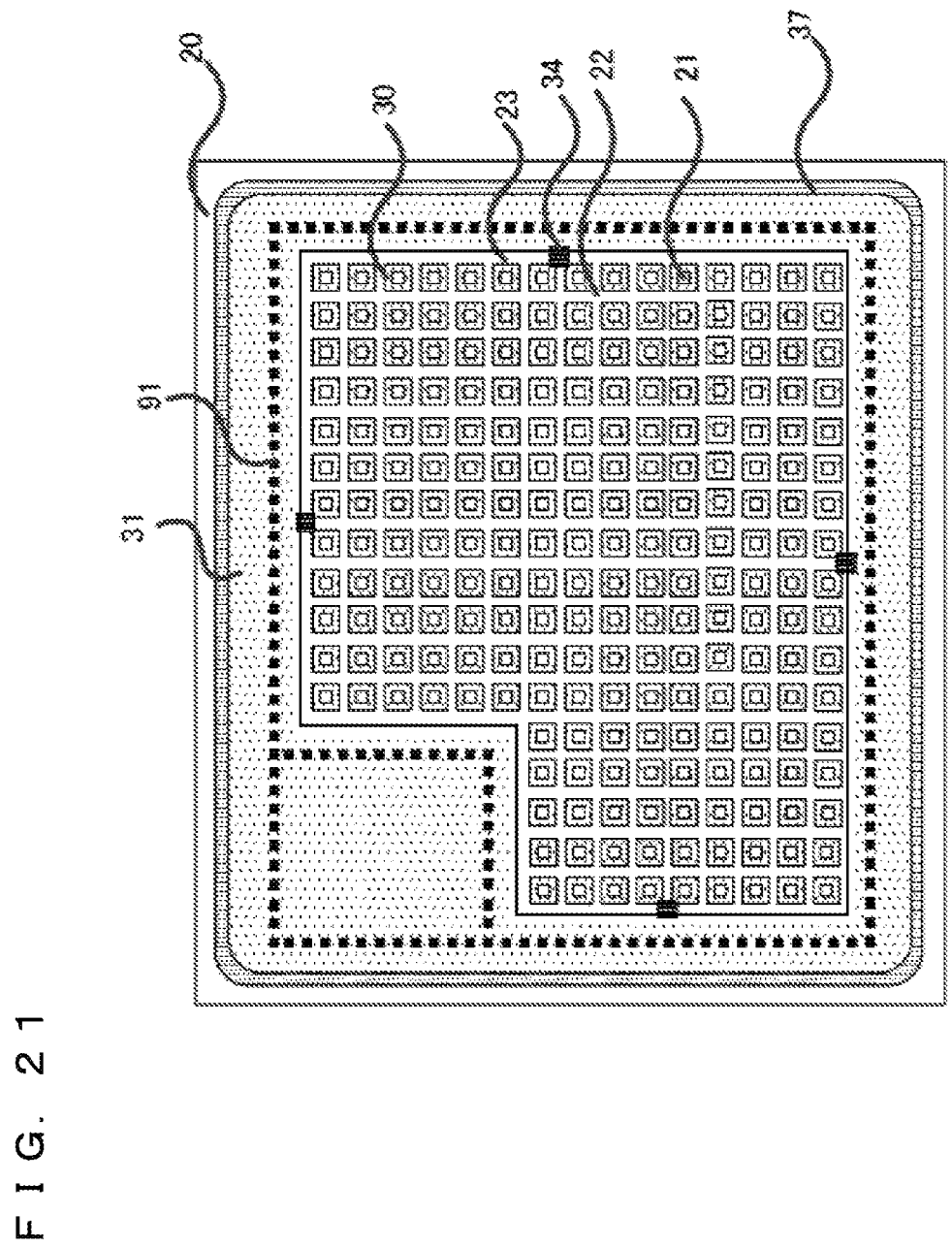
FIG. 21 is a schematic plan view of the silicon carbide semiconductor according to Embodiment 4 of this invention.

FIG. 21 is a schematic plan view of a silicon carbide semiconductor device according to Embodiment 4. In FIG. 21, the first well regions 30 in the active region are connected to the second well region 31 in the terminal region through the auxiliary connection regions 34 of a second conductivity type. FIG. 21 is a drawing applied to Embodiment 1.

The auxiliary connection regions 34 of the second conductivity type should be formed simultaneously with the second well region 31 by changing the ion implantation mask.

When the first well regions 30 in the active region are completely separated from the second well region 31 with the termination structure and the second well region 31 is completely in a floating state, the second well region 31 may be charged up depending on a condition or a structure, which may cause dielectric breakdown in the insulating film on the second well region 31.

Since the second well region 31 is connected to the first well regions 30 through the auxiliary connection regions 34 in the silicon carbide semiconductor device according to Embodiment 4, suppression of the dielectric breakdown in the insulating film on the second well region 31 can more reliably occur, which can more significantly enhance the reliability.

Here, regions near the auxiliary connection regions 34 each located in the vicinity of the center of one side of the silicon carbide semiconductor device in FIG. 21 may be subjected to dielectric degradation due to the passage of a current through the auxiliary connection regions 34 without through the third separation region 23. In contrast, a current flows through the second well region 31 in a plane lateral direction for a long time, in regions near the auxiliary connection regions 34 that are located in the vicinity of the corners of the silicon carbide semiconductor device in FIG. 21. Then, the voltage drop caused by a sheet resistance in the second well region 31 occurs, so that the passage of the bipolar current is suppressed.

Although the first well regions 30 are connected to the second well region 31 in many points in FIG. 7 according to Embodiment 1, the number of connections between the first well regions 30 and the second well region 31 is limited according to Embodiment 4. Thus, the number of points that may be subjected to dielectric degradation is reduced. This will restrict the dielectric degradation caused by the passage of the bipolar current through the second well region 31.

In the silicon carbide semiconductor device according to Embodiment 4, the possibility of dielectric breakdown occurring when the second well region 31 is in a floating state can be reduced, and reduction in the reliability due to the passage of the bipolar current through the second well region 31 can be minimized.

The regions where the auxiliary connection regions 34 are formed should be shorter than the region where the third separation region 23 is formed, for example, less than or equal to $\frac{1}{10}$ of the length of the region where the third separation region 23 is formed. Consequently, the possibility of dielectric degradation can be reduced to approximately less than or equal to $\frac{1}{10}$, which can significantly enhance the reliability of the elements.

Although n-type (the first conductivity type) impurities are N in Embodiments 1 to 4, they may be phosphorus or arsenic. Although p-type (the second conductivity type) impurities are Al, they may be boron or gallium.

In the MOSFETs described in Embodiments 1 to 4, the gate insulating film 50 is not necessarily an oxide film made of silicon oxide, but may be an insulating film other than an oxide film or a combination of an insulating film other than an oxide film and an oxide film. Although silicon oxide resulting from thermal oxidation of silicon carbide is used for forming the gate insulating film 50, a deposited film formed by CVD using silicon oxide may be used. Further, the present invention is also applicable to a MOSFET with a super junction structure.

The devices described in Embodiments above are the MOSFETs each with the gate insulating film 50. Meanwhile, the present invention is applicable to any unipolar device, for example, a junction FET (JFET) and a metal-semiconductor field effect transistor (MESFET) without the gate insulating film 50.

Although the ohmic electrodes 70 and the first Schottky electrodes 71 for the source are formed separately in Embodiments above, they may be formed continuously with the same material or different materials.

The first Schottky electrodes 71 and the second Schottky electrodes 73 may be formed of the same material or different materials.

Embodiments above describe, for example, a crystal structure, a plane direction of a main surface, an off angle, and each implantation condition using the specific examples. However, the applicability should not be limited to the given numerical ranges.

Embodiment 5

Embodiment 5 will describe a power converter to which the silicon carbide semiconductor devices according to Embodiments 1 to 4 are applied. Although the present invention is not limited to specific power converters, Embodiment 5 will describe application of the present invention to a three-phase inverter.

FIG. 22 is a block diagram illustrating a configuration of a power conversion system to which the power converter according to Embodiment 5 is applied.

The power conversion system illustrated in FIG. 22 includes a power supply 100, a power converter 200, and a load 300. The power supply 100, which is a DC power supply, supplies a DC power to the power converter 200. The power source 100 may include various types of components such as a direct current system, a solar battery, or a rechargeable battery, and may include a rectifying circuit connected to an AC system or an AC/DC converter. The power source 100 may include a DC/DC converter which converts a DC power output from a DC system into a predetermined power.

The power converter 200, which is a three-phase inverter connected between the power source 100 and the load 300, converts the DC power supplied from the power source 100 into the AC power to supply the AC power to the load 300. As illustrated in FIG. 22, the power converter 200 includes a main conversion circuit 201 which converts the DC power into the AC power, a drive circuit 202 which outputs a drive signal for driving each switching element in the main conversion circuit 201, and a control circuit 203 which outputs, to the drive circuit 202, a control signal for controlling the drive circuit 202.

The load 300 is a three-phase electrical motor driven by the AC power supplied from the power converter 200. The load 300 is not limited to specific use but is an electrical motor mounted on various types of electrical devices. Thus, the load 300 is used as an electrical motor for, for example, a hybrid car, an electrical car, a rail vehicle, an elevator, or air-conditioning equipment.

The power converter 200 will be described in detail hereinafter. The main conversion circuit 201 includes switching elements and free-wheeling diodes (not shown). Switching of the switching element causes the DC power supplied from the power supply 100 to be converted into the AC power. The AC power is then supplied to the load 300. The specific circuit configuration of the main conversion circuit 201 is of various types. The main conversion circuit 201 according to Embodiment 5 is a three-phase full-bridge circuit having two levels, and includes six switching elements and six free-wheeling diodes anti-parallel connected to the respective switching elements. The silicon carbide semiconductor device according to one of Embodiments 1 to 4 is applied to each of the switching elements of the main conversion circuit 201. The six switching elements form three pairs of upper and lower arms in each pair of which the two switching elements are serially connected to each other. The three pairs of upper and lower arms form the respective phases (U-phase, V-phase, and W-phase) of the full-bridge circuit. Output terminals of the respective pairs of upper and lower arms, i.e., three output terminals of the main conversion circuit 201 are connected to the load 300.

The drive circuit 202 generates drive signals for driving the switching elements of the main conversion circuit 201, and supplies the drive signals to control electrodes of the switching elements of the main conversion circuit 201. Specifically, the drive circuit 202 outputs, to the control electrodes of the switching elements in accordance with the control signal from the control circuit 203 to be described later, the drive signal for switching the switching element to an ON state and the drive signal for switching the switching element to an OFF state. The drive signal is a voltage signal (ON signal) equal to or higher than a threshold voltage of the switching element when the switching element is kept in the ON state. The drive signal is a voltage signal (OFF signal) equal to or lower than the threshold voltage of the switching element when the switching element is kept in the OFF state.

The control circuit 203 controls the switching elements of the main conversion circuit 201 so that a desired power is supplied to the load 300. Specifically, the control circuit 203 calculates a time (ON time) when each of the switching elements of the main conversion circuit 201 should enter the ON state, based on the power to be supplied to the load 300. For example, the main conversion circuit 201 can be controlled by performing PWM control for modulating the ON time of the switching elements in accordance with the voltage to be output. Then, the control circuit 203 outputs a control instruction (control signal) to the drive circuit 202 so that the drive circuit 202 outputs the ON signal to the switching element which should enter the ON state and outputs the OFF signal to the switching element which should enter the OFF state at each time. The drive circuit 202 outputs the ON signal or the OFF signal as the drive signal to the control electrode of each of the switching elements in accordance with this control signal.

Since the silicon carbide semiconductor devices according to Embodiments 1 to 4 are applied to the power converter according to Embodiment 5 as the switching elements of the main conversion circuit 201, a low-loss power converter that performs more reliable high-speed switching can be implemented.

Although Embodiment 5 describes the example of applying the present invention to the three-phase inverter having the two levels, the present invention is not limited thereto but can be applied to the various power converters. Although Embodiment 5 describes the power converter having the two levels, the power converter may have three or multiple levels. The present invention may be applied to a single-phase inverter when the power is supplied to a single-phase load. Moreover, the present invention is also applicable to a DC/DC converter or an AC/DC converter when the power is supplied to, for example, a DC load.

The power converter to which the present invention is applied is not limited to a power converter including a motor as the load. The power converter can also be used as a power-supply device of an electrical discharge machine, a laser beam machine, an induction heat cooking device, or a non-contact power feeding system, and can be further used as a power conditioner of, for example, a solar power system or an electricity storage system.

EXPLANATION OF REFERENCE SIGNS

10 semiconductor substrate, 20 drift layer, 21 first separation region, 22 second separation region, 23 third separation region, 24 fourth separation region, 25 fifth separation region, 30 first well region, 31 second well region, 32 contact region, 33 second contact region, 34 auxiliary connection region, 37 JTE region, 38 auxiliary region, 39 ground auxiliary region, 40 source region, 45 silicon carbide conductive layer, 50 gate insulating film, 51 field insulating film, 55 interlayer insulating film, 60 gate electrode, 70 ohmic electrode, 74 second ohmic electrode, 71 first Schottky electrode, 73 second Schottky electrode, 80 source electrode/source pad, 81 gate pad, 82 gate line, 84 drain electrode, 90 first contact hole, 91 second contact hole, 92 second-well-region contact hole, 95 gate contact hole, 100 power supply, 200 power converter, 201 main conversion circuit, 202 drive circuit, 203 control circuit, 300 load.

The invention claimed is:
1. A silicon carbide semiconductor device, comprising:
a semiconductor substrate made of silicon carbide of a first conductivity type;
a drift layer of the first conductivity type, the drift layer being formed on the semiconductor substrate;
a plurality of first well regions of a second conductivity type, the first well regions being formed in a surface layer of the drift layer;
a plurality of first separation regions of the first conductivity type, the first separation regions being formed adjacent to the first well regions from a surface of the first well regions to the drift layer;

a first Schottky electrode formed on each of the first separation regions, the first Schottky electrode forming a Schottky junction with the first separation region;

an ohmic electrode formed on each of the first well regions;

a second well region of the second conductivity type, the second well region being formed in the surface layer of the drift layer separately from the first well regions;

a plurality of fourth separation regions of the first conductivity type, the fourth separation regions being formed adjacent to the second well region from a surface of the second well region to the drift;

a second Schottky electrode formed on each of the fourth separation regions, the second Schottky electrode forming a Schottky junction with the fourth separation region;

a source region of the first conductivity type, the source region being formed in a surface layer area of each of the first well regions;

a gate insulating film formed on the first well regions and the second well region;

a gate electrode formed on the gate insulating film on the first well regions and the second well region;

a gate pad connected to the gate electrode and formed above the second well region;

a source electrode electrically connected to the first Schottky electrodes, the second Schottky electrodes, and the ohmic electrodes, the source electrode having a non-ohmic connection to the second well region; and ground auxiliary regions of the second conductivity type, the ground auxiliary regions being adjacent to the second well region through a fifth separation region of the first conductivity type and having an ohmic connection to the source electrode.

2. The silicon carbide semiconductor device according to claim 1, wherein the fourth separation regions are formed at intervals shorter than intervals of the first separation regions.

3. The silicon carbide semiconductor device according to claim 1, wherein the first well regions are separated from the second well region.

4. The silicon carbide semiconductor device according to claim 1, comprising:

a field insulating film formed on the second well region, the field insulating film being thicker than the gate insulating film; and a second contact hole formed through the field insulating film, the second contact hole being connected to the second Schottky electrode and the source electrode.

5. The silicon carbide semiconductor device according to claim 4, wherein a boundary between the gate insulating film and the field insulating film is between the first separation region and the fourth separation regions.

6. The silicon carbide semiconductor device according to claim 1, comprising a silicon carbide conductive layer formed in an upper layer area of the second well region, the silicon carbide conductive layer being lower in resistance than the second well region.

7. The silicon carbide semiconductor device according to claim 1, wherein the gate electrode is formed above a portion between the fourth separation regions.

8. The silicon carbide semiconductor device according to claim 1, wherein the gate electrode formed above a portion between the fourth separation regions is wider than the gate electrode formed above a portion between the first separation regions near the first well regions.

9. The silicon carbide semiconductor device according to claim 1, wherein the second Schottky electrode is formed partly on the second well region, and a region of the second well region that is in contact with the second Schottky electrode is lower in impurity concentration than a region of the second well region that is distant from the second Schottky electrode in a depth direction.

10. The silicon carbide semiconductor device according to claim 4, wherein the second Schottky electrode is formed on the fourth separation regions formed in the second contact hole in a planar view and on auxiliary regions of the second conductivity type that are formed between the fourth separation regions, and a region of the auxiliary regions that is in contact with the second Schottky electrode is lower in impurity concentration than a region of the auxiliary regions that is distant from the second Schottky electrode in a depth direction.

11. The silicon carbide semiconductor device according to claim 1, wherein the fourth separation regions are formed inside or between the ground auxiliary regions in a planar view.

12. The silicon carbide semiconductor device according to claim 1, wherein the second Schottky electrode is formed across the second well region, the fifth separation region, and the ground auxiliary regions.

13. The silicon carbide semiconductor device according to claim 1, comprising a second ohmic electrode between the ground auxiliary regions and the source electrode.

14. The silicon carbide semiconductor device according to claim 1, comprising a second contact region formed in an upper portion of the ground auxiliary regions, the second contact region being higher in impurity concentration of the second conductivity type than the ground auxiliary regions.

15. A power converter, comprising:

a main conversion circuit including the silicon carbide semiconductor device according to claim 1, and converting an input power to output a resulting power;

a drive circuit outputting, to the silicon carbide semiconductor device, a drive signal for driving the silicon carbide semiconductor device; and a control circuit outputting, to the drive circuit, a control signal for controlling the drive circuit.

16. The silicon carbide semiconductor device according to claim 1, wherein the fourth separation regions are formed in a plane direction at a density higher than a density of the first separation regions.

* * * * *